United States Patent [19]
Honda et al.

[11] Patent Number: 5,586,136
[45] Date of Patent: Dec. 17, 1996

[54] SEMICONDUCTOR LASER DEVICE WITH A MISORIENTED SUBSTRATE

[75] Inventors: Shoji Honda; Masayuki Shono, both of Osaka-fu; Yasuyuki Bessho, Kyoto; Ryoji Hiroyama, Osaka-fu; Hiroyuki Kase, Osaka-fu; Takatoshi Ikegami, Osaka-fu, all of Japan

[73] Assignee: Sanyo Electric Co., Ltd., Moriguchi, Japan

[21] Appl. No.: 270,056

[22] Filed: Jul. 1, 1994

[30] Foreign Application Priority Data

Jul. 1, 1993 [JP] Japan .................................. 5-163515

[51] Int. Cl.⁶ .................................................... H01S 3/19
[52] U.S. Cl. ................................................ 372/45; 372/43
[58] Field of Search .................................. 372/43, 45, 50

[56] References Cited

U.S. PATENT DOCUMENTS

| | | | |
|---|---|---|---|
| 4,581,742 | 4/1986 | Botez | 372/45 |
| 4,815,089 | 3/1989 | Miyauchi et al. | 372/45 |
| 5,272,712 | 12/1993 | Arimoto et al. | 372/45 |
| 5,274,656 | 12/1993 | Yoshida | 372/45 |
| 5,276,698 | 1/1994 | Yoshida et al. | 372/45 |
| 5,319,660 | 6/1994 | Chen et al. | 372/45 |
| 5,363,392 | 11/1994 | Kasukawa et al. | 372/45 |

OTHER PUBLICATIONS

H. C. Casey, Jr.; M. B. Panish Heterostructure Lasers Part B: Materials and Operating Characteristics, pp. 7–8 1978.
High–Power operation of 630 μm–band tensile strained multiquantum–well AlGaInP laser diodes with a multiquantum barrier; Shono et al, *ELECTRONICS LETTERS*, 27th May 1993, vol. 29, No. 11, pp. 1010–1011.
High temperature (77° C.) operation of 634 μm InGaAlP multiquantum–well laser diodes with tensile–strained quantum wells; Watanabe et al., *Appl. Phys. Lett.*, 63 (11) 13 Sep. 1993.
AlGaInP strained multiple–quantum–well visible laser diodes ($\eta_L \leq 630$ μm band) with a multiquantum barrier grown on misoriented substrates; Hamada et al., *IEEE Journal of Quantum Electronics*, vol. 29, No. 6, Jun. 1993.
Japanese Patent Laid–Open Gazette No. 181361/1994 (6-181361). (Jun. 6, 1994).
Japanese Patent Laid–Open Gazette No. 291687/1993 (5-291687). (Nov. 5, 1993).
29a–k–5 "Strain–compensated multiple quantum well 630 μm band AlGaInP laser diodes"; Hiroyama et al., *Extended Abstracts* (The 41st Spring Meeting, 1994) No. 3, Mar. 1994.
Self–pulsation 630 nm–band tensile strained MQW AlGaInP diodes; Ikegami et al., *Summaries of papers presented at the conference on lasers and electro–optics*, vol. 8, 1994 technical Digest Series Conference Edition. (May).
T. Tanaka et al., *Tensile Strained QW Structure For Low–Threshold Operation of Short–Wavelenght AlGaInP LDs Emitting In the 630 nm Band*, IEE 1993, 19 Jan. 1993, pp. 606–607.
T. Katsuyama et al., *637 nm cw Operation of Low Threshold Current AlGaInP Strained Single Quantum Well Laser Diodes*, Extended Abstracts of the 1991 International Conference on Solid State Devices and Materials, Yokohama, 1991, pp. 117–119. (no month available).

*Primary Examiner*—Rodney B. Bovernick
*Assistant Examiner*—Yisuu Song
*Attorney, Agent, or Firm*—Darby & Darby, P.C.

[57] ABSTRACT

A semiconductor laser device according to the present invention comprises a GaAs substrate of a first conductivity type, a cladding layer of the first conductivity type formed on one main surface of the substrate, an active layer having a quantum well structure in which a tensile strain quantum well layer and a quantum barrier layer which are formed on the cladding layer of the first conductivity type are alternately laminated, and a cladding layer of a second conductivity type formed on the active layer. The one main surface of the substrate is a surface misoriented by 9° to 17° from a {100} plane of the substrate in a <011> direction, and the cavity length is not less than 150 μm nor more than 300 μm.

30 Claims, 11 Drawing Sheets

SEMICONDUCTOR LASER DEVICE WITH A MISORIENTED SUBSTRATE

BACKGROUND OF THE INVENTION

1. Field of the Invention

The present invention relates to a visible-light semiconductor laser device such as a semiconductor laser device of an AlGaInP system.

2. Description of the Prior Art

As a semiconductor laser device having an oscillation wavelength of 630 nm, in a semiconductor laser device of an AlGaInP system has been conventionally studied and developed actively. Since visibility is high in the wavelength of 630 nm, such a device is used for a laser pointer, a line marker or the like. When the device is used for such a product, the device is powered by battery drive in many cases. Therefore, it is desired to develop a device consuming little power.

On the other hand, a light source for recording and reading to and from an optical disk or the like and a light source of a laser printer or the like, requires for a semiconductor laser device oscillating in a wavelength in a visible-light region. Examples of this type of visible-light laser currently used include a semiconductor laser device comprising an active layer having a quantum well (QW) structure on a GaAs substrate.

The above described visible-light laser, requires the shorter oscillation wavelength. A semiconductor laser of an AlGaInP system oscillating in a band of 630 nm is considered for such a device. The decrease in the wavelength makes it possible to significantly improve the recording density in the optical disk or the like and the semiconductor laser of an AlGaInP system can replace He—Ne gas laser having an oscillation wavelength ($\lambda$) of 630 nm.

As described in the foregoing, semiconductor laser device, having the active layer a quantum well (QW) structure has been studied. Particularly in order to improve temperature characteristics and characteristics of oscillation threshold current, it is proposed that strains are introduced into a quantum well layer. A semiconductor laser device of an AlGaInP system with a strained multiple quantum well (S-MQW) structure is described in Proceedings of 53th Conference on Applied Physics (Autumn '92), No. 3, 18a-V-10, pp. 954.

For the purpose of less power consumption, however, the oscillation threshold current of the above described device is closely related to the power consumption and is preferably approximately 40 mA or less, and is more preferably approximately 30 mA or less under practically ordinary conditions, for example, conditions under which a device is mounted on a silicon (Si) heat sink fastened on a good heat radiator (a copper block) of, for example, a stem. In the above described semiconductor laser device having a short oscillation wavelength, however, only an oscillation threshold current of up to approximately 60 mA is obtained under assurance of stable operation at a temperature of 40° C. In addition, when the semiconductor laser device is used for recording and reading to and from an optical disk or the like, it is desired to make the stem small even if heat dissipation characteristics are sacrificed to some extent because of demand for miniaturization of equipment. A small stem having a diameter of from 9 mm and in the future, approximately 5.6 mm is desired. In order to use such a small stem, it is preferred that power consumption is made as small as possible. Moreover, if the semiconductor laser device is incorporated into a system such as an optical disk recording device, temperature assurance of 60° C. is required.

In the conventional device having no strains, it is known that the oscillation threshold current can be gradually decreased by decreasing the cavity length. In such a case, however, it is impossible to increase the reliability, that is, set the maximum operating temperature (the highest temperature at which oscillation is possible) closely related to the reliability to approximately 50° C. or more and preferably, approximately 60° C. or more. Accordingly, a semiconductor laser device consuming little power cannot be put to practical use.

Furthermore, a quantum well semiconductor laser device of an AlGaInP system having tensile strains has been known, which is described in, for example, Proceedings of 53th Conference on Applied Physics (Autumn '92), No. 3, 18a-V-11, pp. 954. In this case, however, an oscillation threshold current is practically approximately 60 mA. It is impossible to set the oscillation threshold current to approximately 40 mA or less when the maximum operating temperature (the highest temperature at which oscillation is possible) is approximately 50° C. or more under the foregoing conditions.

SUMMARY OF THE INVENTION

The present invention has been made in view of the foregoing problems and has for its object to provide a semiconductor laser device which is reliable and consumes little power.

A semiconductor laser device according to the present invention comprises a GaAs substrate of a first conductivity type, a cladding layer of the first conductivity type formed on one main surface of the substrate, an active layer having a quantum well structure in which a tensile strain quantum well layer and a quantum barrier layer which are formed on the cladding layer of the first conductivity type are alternately laminated, and a cladding layer of a second conductivity type formed on the active layer. The one main surface of the substrate is a surface misoriented by not less than 9° nor more than 17° from a {100} plane of the substrate in a <011> direction, and the cavity length is not less than 150 μm nor more than 300 μm.

In the first construction of the present invention, step flow growth is made on at least one main surface of the substrate misoriented by not less than 9° nor more than 17° from the {100} plane in the <011> direction. In addition, a tensile strain is introduced into the well layer, thereby to make it possible to make the well layer wider than one in a conventional device, resulting in improved crystallizability of each of the layers. The cavity length is set to not less than 150 μm nor more than 300 μm. This makes it possible to increase the maximum operating temperature and decrease the oscillation threshold current.

Another semiconductor laser device according to the present invention comprises a GaAs substrate of a first conductivity type, a cladding layer of the first conductivity type formed on one main surface of the substrate, an active layer having a quantum well structure in which a compressive strain quantum well layer and a quantum barrier layer which are formed on the cladding layer of the first conductivity type are alternately laminated. A cladding layer of a second conductivity type is formed on the active layer, and the one main surface of the substrate is a surface misoriented by not less than 9° nor more than 17° from a {100} plane of the substrate in a <011> direction. Also the cavity length is not less than 150 μm nor more than 300 μm.

In the second embodiment of the present invention, step flow growth is made on at least one main surface misoriented by not less than 9° nor more than 17° from the {100} plane in the <011> direction, so that the interface between the well layer and the barrier layer is abrupt. In addition, a compressive strain is introduced into the well layer, thereby to make it possible to decrease the density of the state of holes in a valence band and to decrease the current density at which oscillation is started. The cavity length is set to not less than 150 μm. This nor more than 300 μm, makes it possible to increase the maximum operating temperature and decrease the oscillation threshold current.

Still another semiconductor laser device according to the present invention comprises a GaAs substrate of a first conductivity type, a cladding layer of a first conductivity type formed on one main surface of the substrate, an active layer having a strain compensated type quantum well structure in which a quantum well layer and a quantum barrier layer which are formed on the cladding layer of the first conductivity type and on which strains in the opposite directions are exerted are alternately laminated. A cladding layer of a second conductivity type is formed on the active layer, and the one main surface of said substrate is a surface misoriented by not less than 9° nor more than 17° from a {100} plane of the substrate in a <011> direction. Also the cavity length is not less than 150 μm nor more than 300 μm.

In the third embodiment of the present invention, step flow growth is made on at least one main surface of the substrate misoriented by not less than 9° nor more than 17° from the {100} plane in the <011> direction. In addition, the strains in the opposite directions are respectively exerted on the quantum well layer and the quantum barrier layer, so that the value of the strains accumulated in the entire active layer can be decreased. This makes it possible to introduce the larger strain into the well layer. Further, the diffusion speed of holes is increased by introducing a compressive strain on the quantum barrier layer. Accordingly, the holes are uniformly injected into each the well layer, thereby to make it possible to decrease the threshold current. The cavity length is set to not less than 150 μm nor more than 300 μm, thereby to make it possible to increase the maximum operating temperature and decrease the oscillation threshold current.

The foregoing and other objects, features, aspects and advantages of the present invention will become more apparent from the following detailed description of the present invention.

DESCRIPTION OF THE PREFERRED EMBODIMENTS

Figure 1:
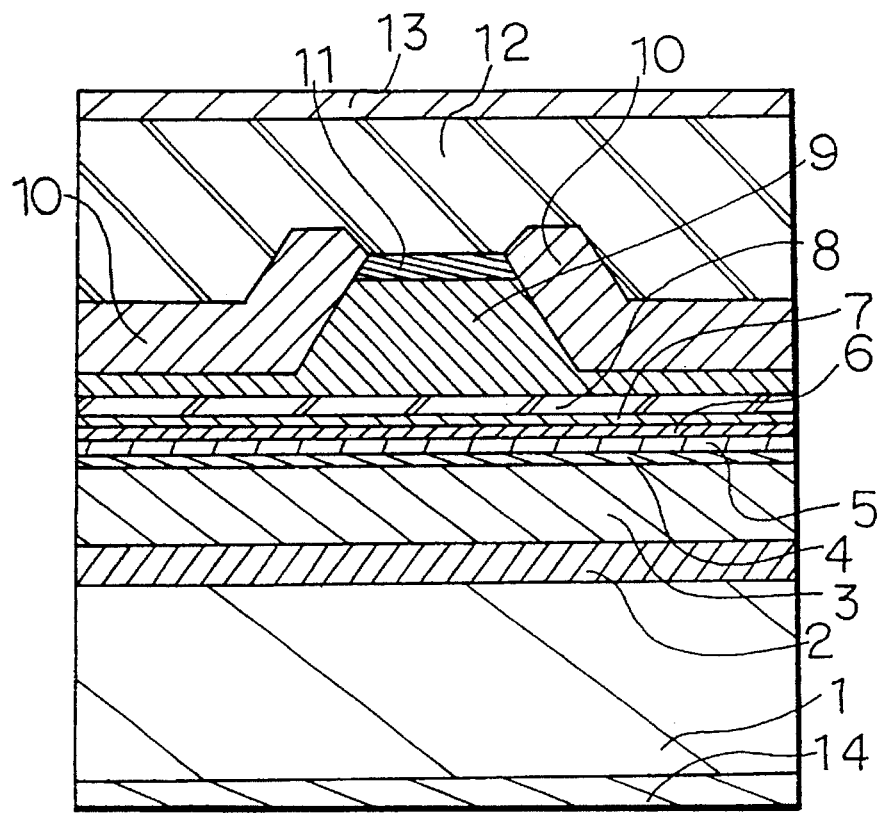
FIG. 1 is a schematic cross sectional view showing the construction of a semiconductor laser device according to a first embodiment of the present invention.
Figure 2:
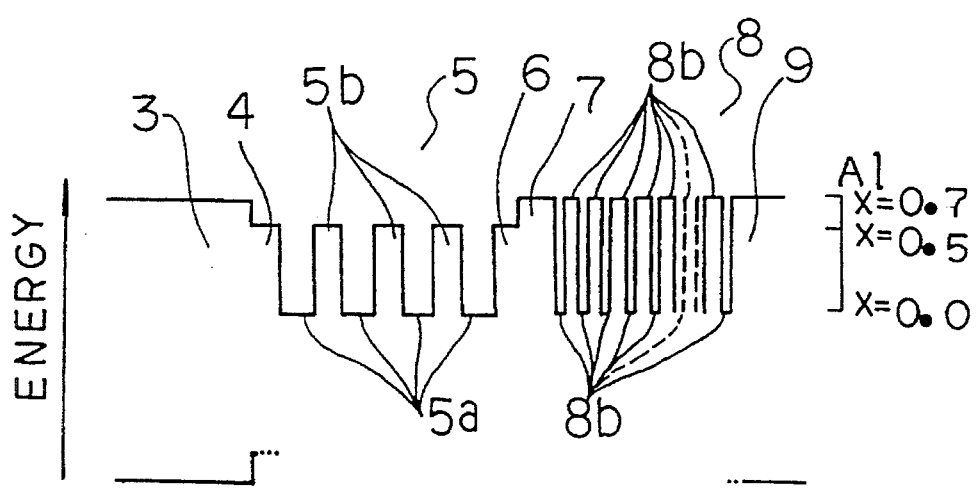
FIG. 2 is a diagram showing a band structure in the vicinity of an active layer of the semiconductor laser device according to the first embodiment.

Description is made of a semiconductor laser device of an AlGaInP system having an oscillation wavelength of 630 nm according to a first embodiment of the present invention with reference to the drawings. FIG. 1 is a schematic cross sectional view showing the construction of the semiconductor laser device, and FIG. 2 is a diagram showing a band structure in the vicinity of an active layer of the semiconductor laser device.

The present invention uses an n-type GaAs substrate 1, and one main surface of the GaAs substrate 1 is a surface misoriented by an angle θ (θ=9° to 17°: the angle θ shall be referred to as an off angle θ) from a (100) plane of the substrate in a (100) [011] direction. An n-type $Ga_{0.5}In_{0.5}P$ buffer layer 2 having a thickness of 0.3 μm and an n-type $(Al_{xa}Ga_{1-xa})_{0.5}In_{0.5}P$ (xa>ya, yb>p≧0: xa=0.7 in the present embodiment) cladding layer 3 having a thickness of 0.8 to 0.9 μm are formed in this order on the one main surface by a molecular beam epitaxy (MBE) method, a metal organic chemical vapor deposition (MOCVD) method or the like.

An undoped $(Al_{ya}Ga_{1-ya})_{0.5}In_{0.5}P$ (ya≧r: ya=0.5 in the present embodiment) optical guide layer 4 having a thickness of 500 Å, an undoped active layer 5 having a tensile strain multiple quantum well structure (a tensile strain MQW structure) obtained by alternately laminating $(Al_pGa_{1-p})_qIn_{1-q}P$ (q>0.51: p=0, q=0.58 in the present embodiment) tensile strain quantum well layers 5a (typically a total of not more than 8 layers: a total of four layers in the present invention) having a tensile strain 75 Å in thickness and $(Al_rGa_{1-r})_{0.5}In_{0.5}P$ (xa, xb, c>r>p: r=0.5 in the present embodiment) quantum barrier layers 5b (typically a total of not more than 7 layers: a total of three layers in the present embodiment) 40 Å in thickness, an undoped $(Al_{yb}Ga_{1-yb})_{0.5}In_{0.5}P$ (yb≧r: yb=0.5 in the present embodiment) optical guide layer 6 having a thickness of 500 Å are formed in this order using the MBE method, the MOCVD method or the like. The value of the strain on the tensile strain quantum well layers 5a, $\Delta a_w$, in the present embodiment is −0.5%.

The value of the strain is defined as follows in a case where $a_0$ is taken as the lattice constant of the GaAs substrate 1, $a_w$ is taken as the lattice constant of the well layers 5a, and $a_b$ is taken as the lattice constant of the barrier layers 5b. The value of the strain on the quantum well layers 5a, $\Delta a_w$, is defined as $\Delta a_w=(a_w-a_0)/a_0$, and the value of a strain on the barrier layers 5b and the guide layers 4 and 6, $\Delta a_b$, is defined as $\Delta a_b=(a_b-a_0)/a_0$.

A p-type $(Al_{xb}Ga_{1-xb})_{0.5}In_{0.5}P$ (xb>ya, yb>p≧0: xb=0.7 in the present embodiment) cladding layer 7 having a thickness of 300 Å is formed on the optical guide layer 6. A multiple quantum barrier (MQB) structure layer 8 obtained by alternately laminating $(Al_tGa_{1-t})_uIn_{1-u}P$ (t<v: t=0, u=0.5 in the present embodiment) quantum well layers 8a (a total of 10 layers) 8 Å in thickness and p-type $(Al_vGa_{1-v})_wIn_{1-w}P$ (preferably v=xb=xc: v=0.7, w=0.5 in the present embodiment) quantum barrier layers 8b (a total of 9 layers) 12 Å in thickness is formed on the p-type cladding layer 7.

A p-type $(Al_{xc}Ga_{1-xc})_{0.5}In_{0.5}P$ (xc>ya, yb>p≧0: xc=0.7 in the present embodiment) cladding layer 9 having a stripe-shaped ridge 0.9 μm in height, 5 μm in width in its lower surface portion and extending in the direction of the cavity length, and having a thickness of 0.2 to 0.3 μm on both sides of the ridge is formed on the multiple quantum barrier structure layer 8.

n-type GaAs current blocking layers 10 having a thickness of 1 μm are formed on the p-type cladding layer 9 to cover both side surfaces of the ridge, and a p-type $Ga_{0.5}In_{0.5}P$ contact layer 11 having a thickness of 0.1 μm is formed on the surface of the ridge.

A p-type GaAs cap layer 12 having a thickness of 2 to 5 μm on the contact layer 11 is formed on the current blocking layers 10 and the contact layer 11.

A p-type ohmic electrode 13 composed of Au—Cr is formed on the upper surface of the cap layer 12, and an n-type ohmic electrode 14 composed of Au—Sn—Cr is formed on the lower surface of the n-type GaAs substrate 1.

The semiconductor laser device is so constructed that the active layer 5 is interposed between the optical guide layers 4 and 6 which are equal to (or more than) the quantum barrier layers 5b in a band gap, the optical guide layers 4 to 6 are interposed between the cladding layers 3, 7 and 9 which are more than the optical guide layers 4 and 6 in a band gap, and the multiple quantum barrier structure layer 8 is further provided between the cladding layers 7 and 9, as can be seen from FIG. 2. The index of refraction is decreased as the band gap is increased and hence, the description of the index of refraction is omitted.

A method of manufacturing such a semiconductor laser device will be described briefly.

First, the n-type buffer layer 2, the n-type cladding layer 3, the undoped optical guide layer 4, the undoped active layer 5, the undoped optical guide layer 6, the p-type cladding layer 7, the p-type multiple quantum barrier structure layer 8, the p-type cladding layer 9, and the p-type contact layer 11 are continuously grown by the MOCVD method.

Then, the p-type cladding layer 9 is etched to have a stripe-shaped ridge through a stripe-shaped mask composed of $SiO_2$ or the like on the p-type contact layer 11 and then, the n-type current blocking layers 10 are formed by the MOCVD method. Subsequently, the mask is removed to expose the contact layer 11 and then, the p-type cap layer 12 is formed on the n-type current blocking layers 10 and the contact layer 11 by the MOCVD method.

Then, the p-type ohmic electrode 13 is formed on the upper surface of the cap layer 12, and the n-type ohmic electrode 14 is formed on the lower surface of the n-type GaAs substrate 1 by vacuum evaporation and then, are thermally treated.

Figure 3:
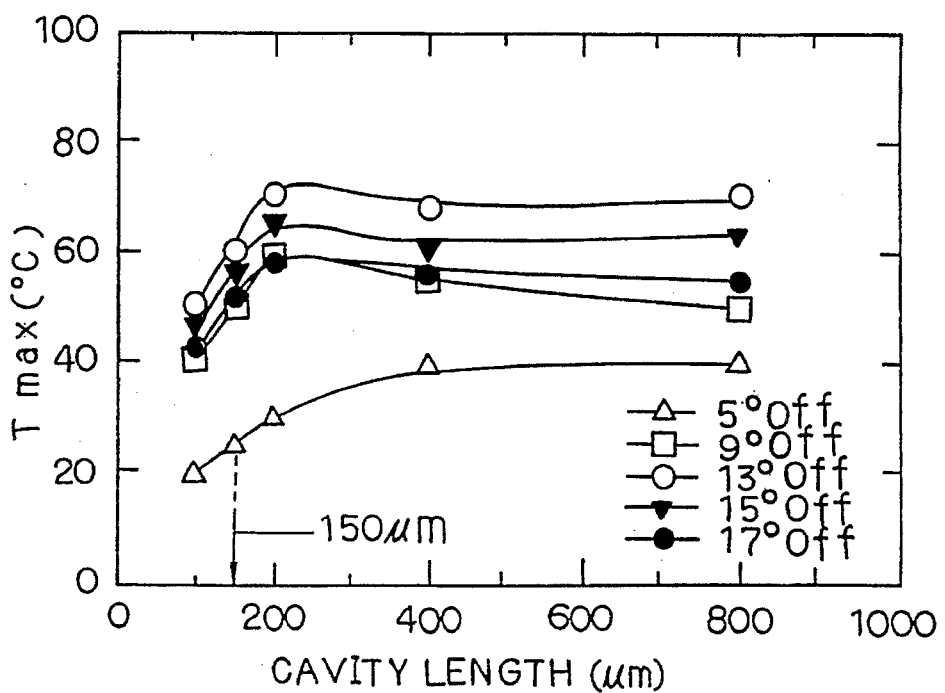
FIG. 3 is a diagram showing the relationship between the maximum operating temperature and the cavity length in the semiconductor laser device according to the first embodiment and a semiconductor laser device in a comparative example.

FIG. 3 shows the relationship between the maximum operating temperature $T_{max}$ (°C.) and the cavity length L (μm) in cases where the main surface of the semiconductor laser device is misoriented by 9°, 13°, 15° and 17° from a (100) plane in a [011] direction and a case where the main surface thereof is misoriented by 5° as a comparative example. In the present embodiment, a front facet of the laser device is coated with a reflection coating film composed of $Al_2O_3$ so that the index of reflection thereof is 30%, and a rear facet of the laser device is coated with a reflection coating film constituted by a laminated film of $Al_2O_3$ and Si so that the index of reflection thereof is 50%. In FIG. 3, an off angle θ=5° is indicated by a hollow triangle, an off angle θ=9° is indicated by a hollow square, an off angle θ=13° is indicated by a hollow circle, an off angle θ=15° is indicated by a solid black triangle, and an off angle θ=17° is indicated by a solid black circle. The measurements are made in a continuously oscillating state in a state where a device is pressed and mounted (fastened) on a Si heat sink (50 to 500 μm in thickness) bonded and mounted (fastened) on a good heat radiator (a copper block) of an ordinary stem having a diameter of 9 mm connected by solder or the like or tin or the like.

As can be seen from FIG. 3, in such a semiconductor laser device, the maximum operating temperature has a peak when the cavity length is 200 μm and is approximately 50° or more when it is not less than 150 μm nor more than 300 μm in the case of the off angle of not less than 9° nor more than 17°. This is unlike the conventionally known phenomenon in which the maximum operating temperature is gradually decreased as the cavity length is decreased. Particularly in the case of the off angle of not less than 13° nor more than 15°, the maximum operating temperature is approximately 60° C. or more.

In a so-called facet coating in which facets of the laser device are coated with, for example, a reflection coating film composed of $Al_2O_3$, if the index of reflection of the front facet is set to 30% and the index of reflection of the rear facet is made higher, the amount of optical confinement is increased, so that the threshold current is decreased. Also, the slope efficiency is improved or the operating current is decreased, thereby to improve the maximum operating temperature. In addition, if the index of reflection of the front facet is decreased to 30% or less, the amount of optical confinement is decreased, so that the threshold current is increased. However, the increase in the threshold current can be prevented by setting the index of reflection of the rear facet to 70% or more. Consequently, light emitted from the front facet is increased, thereby to make it possible to decrease the operating current at the time of high output to the laser device. When the facets are not subjected to facet coating, the indexes of reflection of the front facet and the rear facet are generally 30%.

In the above described embodiment, the same effect is obtained when the index of reflection of the front facet is not less than 30% and the index of reflection of the rear facet is not less than 50% or when the index of reflection of the front facet is not more than 30% and the index of reflection of the rear facet is not less than 70% in the facet coating.

Figure 4:
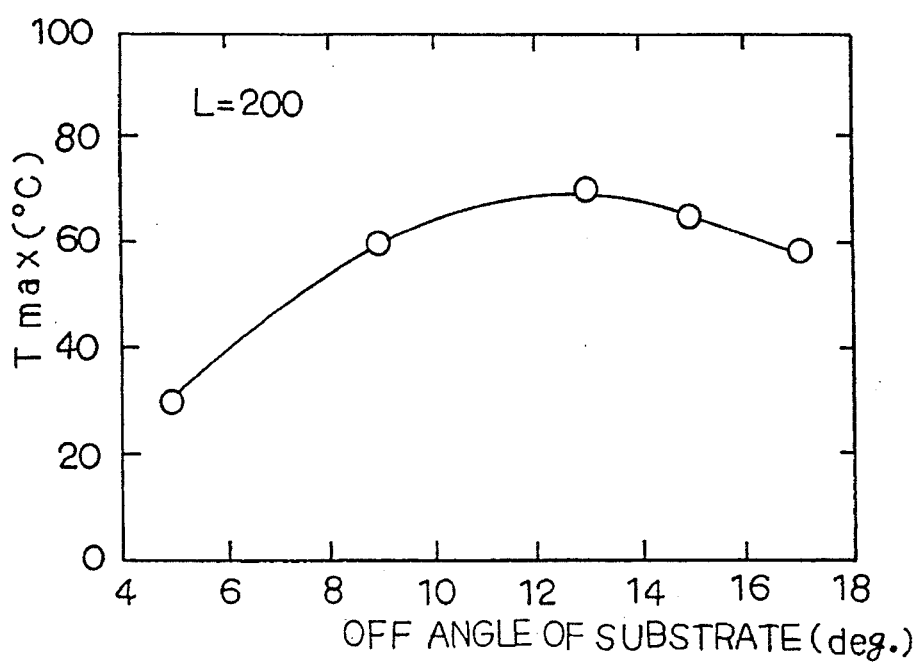
FIG. 4 is a diagram showing the relationship between the maximum operating temperature and the off angle of a GaAs substrate in the semiconductor laser devices according to the first embodiment and in the comparative example.

FIG. 4 shows the relationship between the maximum operating temperature $T_{max}$ (°C.) and the off angle θ (°) of the substrate obtained by making the same measurements as those shown in FIG. 3. The cavity length L is 200 μm.

As can be seen from FIG. 4, in such a semiconductor laser device, the maximum operating temperature is not less than 60° C. when the off angle θ is not less than 9° nor more than 17°. The best results are obtained when θ is not less than 11° nor more than 15°, and more preferable when it is around 13° in the case of the cavity length of 200 μm. In addition, the maximum operating temperature is not less than 60° C. when the off angle θ is not less than 9° nor more than 17°, and preferably when it is not less than 11° nor more than 15°, and is even more preferable when it is approximately 13° also in the case of a cavity length of 300 μm, which is not illustrated. There is the same tendency in the off angle θ if the cavity length is not less than 150 μm nor more than 300 μm.

As can be seen from FIGS. 3 and 4, in such a semiconductor laser device, the cavity length is preferably not less than 150 μm nor more than 300 μm and is more preferably not less than 200 μm nor more than 300 μm, and the off angle θ is preferably not less than 9° nor more than 17° and particularly, not less than 11° nor more than 15° and is more preferably approximately 13°.

Figure 5:
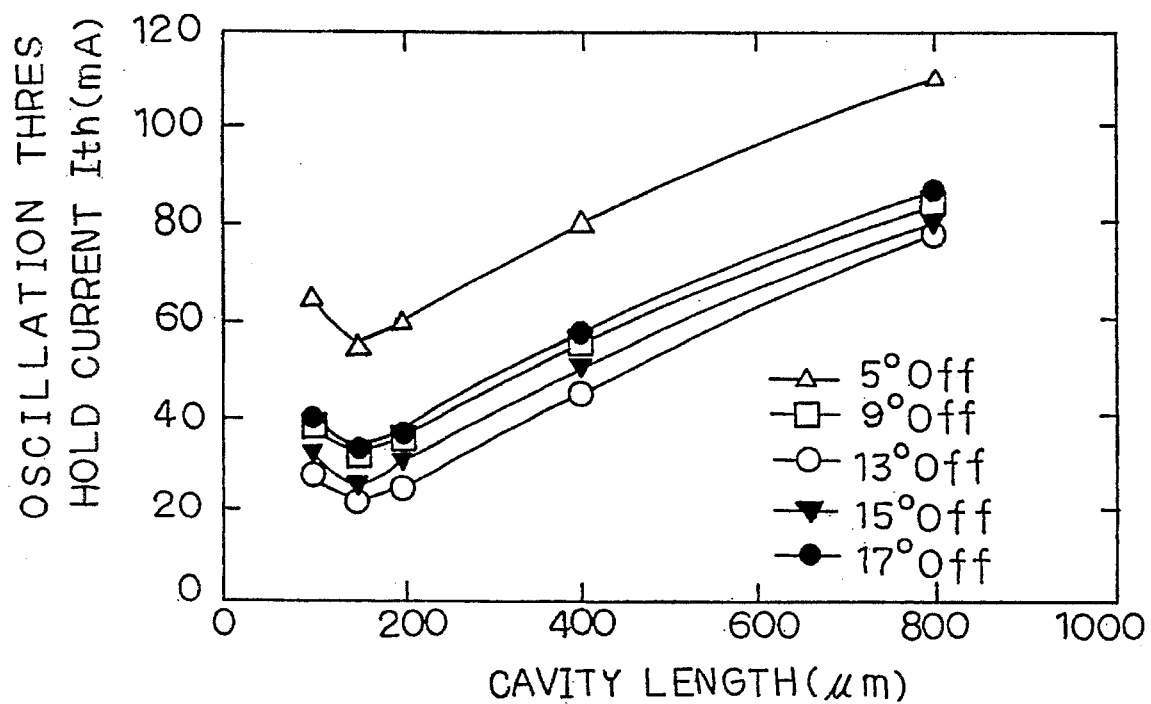
FIG. 5 is a diagram showing the relationship between the oscillation threshold current and the cavity length in the semiconductor laser devices according to the first embodiment and in the comparative example.

FIG. 5 shows the relationship between the oscillation threshold current (mA) and the cavity length L (μm) of the semiconductor laser device in the case of the same off angles θ of the substrate as those shown in FIG. 3. In FIG. 5, the same off angles θ as those shown in FIG. 3 are indicated by the same marks. The measurements are made at a device environmental temperature of 25° C. and in a continuously oscillating state in a state where a device is pressed and mounted (fastened) on a Si heat sink (50 to 500 μm in thickness) bonded and mounted (fastened) on a good radiator (a copper block) of an ordinary stem having a diameter of 9 mm by solder or the like through tin or the like as in the case of FIG. 3.

As can be seen from FIG. 5, even in such a semiconductor laser device, the threshold current is gradually decreased as the cavity length is decreased, as in the conventional semiconductor laser device. Particularly when the off angle θ is not less than 9° nor more than 17°, the threshold current is small. It is found that the threshold current is approximately 40 mA or less when the cavity length is not more than 300 μm, while being approximately 30 mA or less when it is not more than 200 μm.

Figure 6:
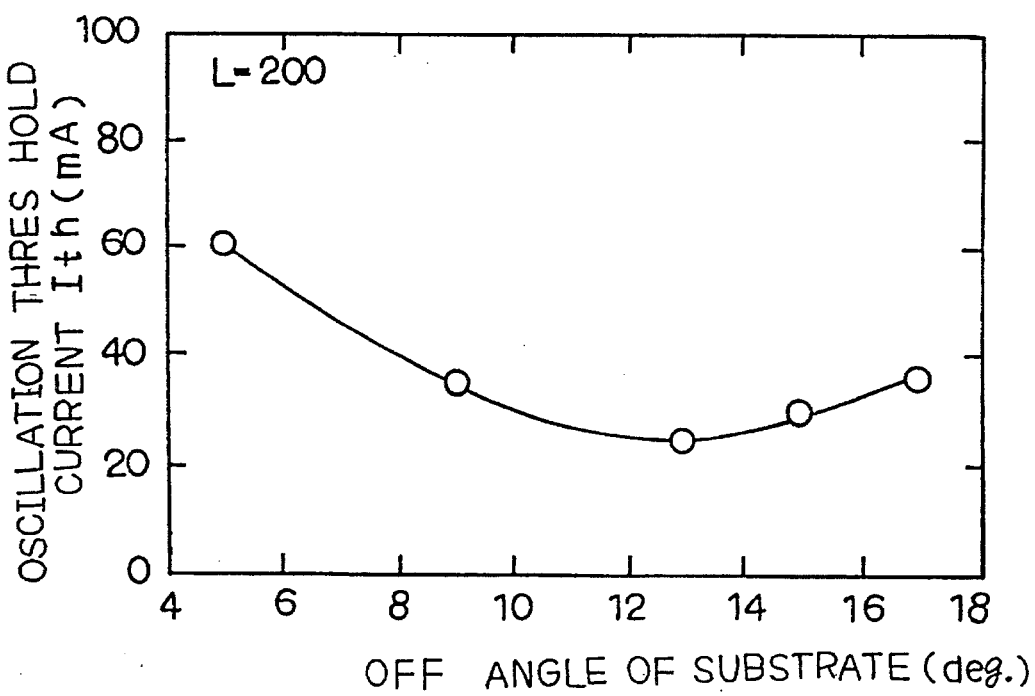
FIG. 6 is a diagram showing the relationship between the oscillation threshold current and the off angle of the GaAs substrate in the semiconductor laser devices according to the first embodiment and in the comparative example.

FIG. 6 shows the relationship between the oscillation threshold current (mA) and the off angle θ (°) of the substrate which are obtained by making the same measurements as those shown in FIG. 5. The cavity length L is 200 μm.

As can be seen from FIG. 6, in such a semiconductor laser device, the threshold current is approximately 40 mA or less when the off angle is not less than 9° nor more than 17°. A preferable range is when the off angle θ is not less than 11° nor more than 17°, and is more preferable when it is around 13° in the case of the cavity length of 200 μm. In addition, the threshold current is approximately 40 mA or less when the off angle θ is not less than 9° nor more than 17°. A preferable range is when it is not less than 11° nor more than 17°, and is even more preferable when it is approximately 13° in the case of a cavity length of 300 μm, which is not illustrated. This tendency is the same if the cavity length is not less than 150 μm nor more than 300 μm.

As can be seen from FIGS. 5 and 6, in such a semiconductor laser device, the cavity length is preferably not more than 300 μm, and the off angle is preferably not less than 9° nor more than 17° and particularly, not less than 11° nor more than 15° and is more preferably around 13°.

As can be seen from FIGS. 3 to 6, in such a semiconductor laser device, the maximum operating temperature can be not less than 50° C. and the threshold current can be approximately 40 mA or less when the cavity length is not less than 150 μm nor more than 300 μm and the off angle θ is not less than 9° nor more than 17°, and the maximum operating temperature can be not less than 60° C. and the threshold current can be approximately 40 mA or less when the cavity length is not less than 200 μm nor more than 300 μm and the off angle θ is not less than 9° nor more than 17°. Particularly, the off angle θ is preferably not less than 11° nor more than 15° and is more preferably around 13°.

Figure 7:
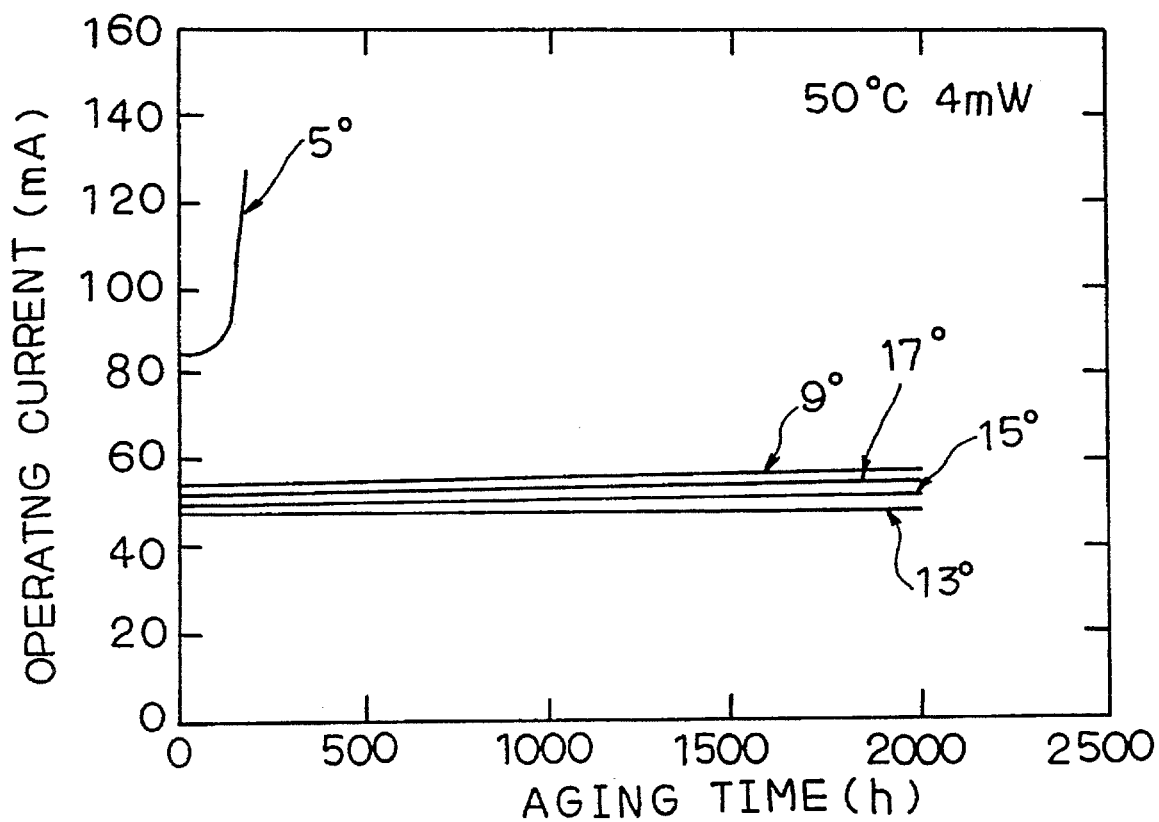
FIG. 7 is a diagram showing the relationship between the aging time and the operating current in the semiconductor laser devices according to the first embodiment and in the comparative example.

FIG. 7 shows the relationship between the operating current (mA) and the aging time (h:hour) in the semiconductor laser device according to the present embodiment shown in FIG. 1 and a semiconductor laser device in a comparative example. The measurements are made at a device environmental temperature of 50° C., at a light output of 4 mW, and in a continuously oscillating state in a state where a device is pressed and mounted (fastened) on a Si heat sink (50 to 500 μm in thickness) bonded and mounted (fastened) on a good radiator (a copper block) of an ordinary stem having a diameter of 9 mm by solder or the like through tin or the like as in the case of FIG. 3. Cases where the off angle θ of the substrate is 9°, 13°, 15° and 17° in the case of the cavity length of 200 μm are shown by way of example.

As can be seen from FIG. 7, the operating current is rapidly increased in approximately several hundred hours in the semiconductor laser device in the comparative example in which the threshold current (operating current) is high, while being approximately constant even in excess of 2000 hours in the semiconductor laser device according to the present embodiment, so that the semiconductor laser according to the present embodiment is superior in reliability. As can be seen from FIGS. 3 to 4, the reason for this is that the semiconductor laser device according to the present embodiment is superior in maximum operating temperature characteristics. If the cavity length is not less than 150 μm nor more than 300 μm and the off angle θ of the substrate is not less than 9° nor more than 17°, the operating current is approximately constant even if the semiconductor laser device is aged similarly for a long time.

Furthermore, as can be seen from FIG. 7, in the semiconductor laser device according to the present embodiment, the operating current is decreased if the threshold current is small, which is conventionally known.

The reason why the semiconductor laser device according to the present embodiment is high in the maximum operating temperature and is low in the oscillation threshold current is that the semiconductor laser device comprises the n-type GaAs substrate 1, the n-type cladding layer 3 formed on one main surface of the substrate 1, the active layer 5 having a quantum well structure comprising the tensile strain quantum well layers 5a formed on the n-type cladding layer 3, and the p-type cladding layers 7 and 9 formed on the active layer 5, the one main surface of the substrate 1 is a surface misoriented by 9° to 17° from the (100) plane in the [011] direction, and the cavity length is not less than 150 μm nor more than 300 μm. Specifically, step flow growth is made on at least the one main surface, so that a abrupt interface is formed. In addition, the tensile strain is introduced into the well layers, thereby to make it possible to make the well layers wider than the conventional one, resulting in improved crystallizability of each of the layers. A multiple quantum barrier layer is preferably provided, although an effect is obtained even if it is not provided.

Although in the above described embodiment, the value of the strain on the quantum well layers in the active layer is −0.5%, an effect is obtained even if the quantum well layers have a tensile strain which differ in value from this strain. The number of well layers is not limited to 4. For example, the number of well layers may be not less than 1 nor more than 8.

Figure 8:
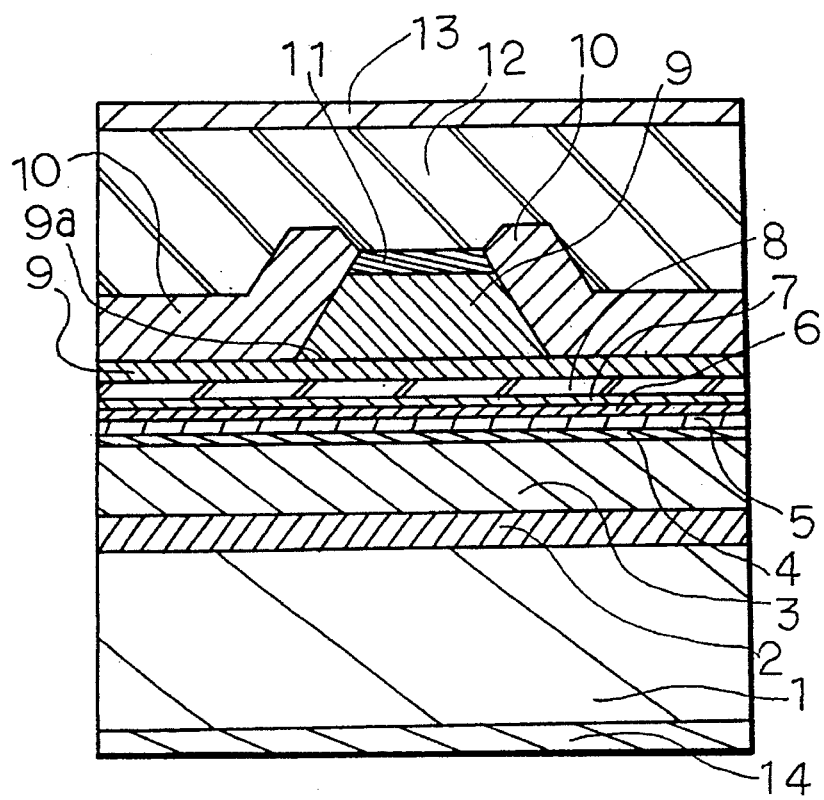
FIG. 8 is a schematic cross sectional view showing the construction of a semiconductor laser device according to a second embodiment of the present invention.
Figure 9:
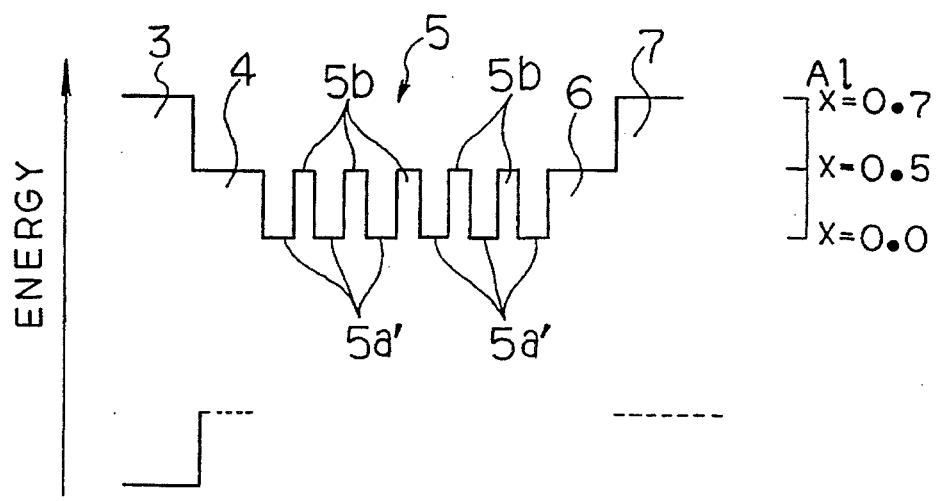
FIG. 9 is a diagram showing a band structure in the vicinity of an active layer of the semiconductor laser device according to the second embodiment.

Description is made of a semiconductor laser device according to a second embodiment of the present invention. The semiconductor laser device according to the present embodiment is a semiconductor laser device of an AlGaInP system having an oscillation wavelength of 635 nm. FIG. 8 is a schematic cross sectional view showing the construction of the semiconductor laser device, and FIG. 9 is a diagram showing a band structure in the vicinity of an active layer of the semiconductor laser device.

The second embodiment of the present invention uses an n-type GaAs substrate 1 similarly to the first embodiment. One main surface of the GaAs substrate 1 is a surface misoriented by an angle θ (θ=9° to 17°: the angle θ shall be referred to as an off angle θ) from a (100) plane of the substrate in a [011] direction. An n-type $Ga_{0.5}In_{0.5}P$ buffer layer 2 having a thickness of 0.3 μm and an n-type $(Al_{xa}Ga_{1-xa})_{0.5}In_{0.5}P$ (xa>ya, yb>p≧0: xa=0.7 in the present embodiment) cladding layer 3 having a thickness of 0.8 to 0.9 μm are formed in this order on the one main surface by a MOCVD method.

An undoped $(Al_{ya}Ga_{1-ya})_{0.5}In_{0.5}P$ (ya≧r: ya=0.5 in the present embodiment) optical guide layer 4 having a thickness of 200 to 500 Å, an undoped active layer 5 having a compressive strain multiple quantum well structure (compressive strain MQW structure) obtained by alternately laminating $(Al_pGa_{1-p})_qIn_{1-q}P$ (q<0.51: p=0.1, q=0.44 in the present embodiment) compressive strain quantum well layers 5a' (typically a total of not more than ten layers: a total of six layers in the present embodiment) having a compressive strain 50 Å in thickness and $(Al_rGa_{1-r})_{0.5}In_{0.5}P$ (xa, xb, c>r>p: r=0.5 in the present embodiment) quantum barrier layers 5'b (typically a total of not more than nine layers: a total of five layers in the present embodiment) 40 Å in thickness, an undoped $(Al_{yb}Ga_{1-yb})_{0.5}In_{0.5}P$ (yb≧r: yb=0.5 in the present embodiment) optical guide layer 6 having a thickness of 200 to 500 Å are formed in this order using the MOCVD method. The value of the strain on the compressive strain quantum well layers 5a', $\Delta a_w$, in the present embodiment is +0.5%.

A p-type $(Al_{xb}Ga_{1-xb})_{0.5}In_{0.5}P$ (xb>ya, yb>p≧0: xb=0.7 in the present embodiment) cladding layer 7 having a thickness of 300 Å is formed on the optical guide layer 6. A multiple quantum barrier (MQB) structure layer 8 obtained by alternately laminating $(Al_tGa_{1-t})_uIn_{1-u}P$ (t<v: t=0, u=0.5 in the present embodiment) quantum well layers 8a' (a total of 10 layers) 8 Å in thickness and p-type $(Al_vGa_{1-v})_wIn_{1-w}P$ (preferably v=xb=xc: v=0.7, w=0.5 in the present embodiment) quantum barrier layers 8b (a total of 9 layers) 12 Å in thickness is formed on the p-type cladding layer 7, as in the above described first embodiment.

A p-type $(Al_{xc}Ga_{1-xc})_{0.5}In_{0.5}P$ (xc>ya, yb>p≧0: xc=0.7 in the present embodiment) cladding layer 9 having a stripe-shaped ridge 0.9 μm in height, 5 μm in width in its lower surface portion and extending in the direction of the cavity length, and having a thickness of a 0.2 to 0.3 μm on both sides of the ridge is formed on the multiple quantum barrier structure layer 8. In the present embodiment, the cladding layer 9 is laminated to a thickness of 0.2 to 0.3 μm from the multiple quantum structure layer 8 so that the layer thickness on both sides of the ridge becomes 0.2 to 0.3 μm in forming the ridge by etching and then, an etching stopper layer 9a is provided. This etching stopper layer 9a is formed so as to differ from the p-type $(Al_{xc}Ga_{1-xc})_{0.5}In_{0.5}P$ cladding layer 9 in the Al composition ratio and have such a thickness as not to absorb laser light. Since they differ in the Al composition ratio, they differ in the etching speed. Accordingly, mesa etching in forming the ridge can be stopped at the etching stopper layer 9a. In the present embodiment, the etching stopper layer 9a is constituted by a p-type $Ga_{0.5}In_{0.5}P$ layer.

n-type GaAs current blocking layers 10 having a thickness of 1 μm are formed on the p-type cladding layer 9 so as to cover both side surfaces of the ridge, and a p-type $Ga_{0.5}In_{0.5}P$ contact layer 11 having a thickness of 0.1 μm is formed on the surface of the ridge.

A p-type GaAs cap layer 12 having a thickness of 2 to 5 μm on the contact layer 11 is formed on the current blocking layers 10 and the contact layer 11.

A p-type ohmic electrode 13 composed of Au—Cr is formed on the upper surface of the cap layer 12, and an n-type ohmic electrode 14 composed of Au—Sn—Cr is formed on the lower surface of the n-type GaAs substrate 1.

The semiconductor laser device is so constructed that the active layer 5 is interposed between the optical guide layers 4 and 6 which are equal to the quantum barrier layers 5b in a band gap, the optical guide layers 4 to 6 are interposed between the cladding layers 3 and 7 which are more than the optical guide layers 4 and 6 in a band gap. Also in the second embodiment, a multiple quantum barrier structure layer 8 is provided between the cladding layers 7 and 9, which is not illustrated in FIG. 9, as in the first embodiment.

Figure 10:
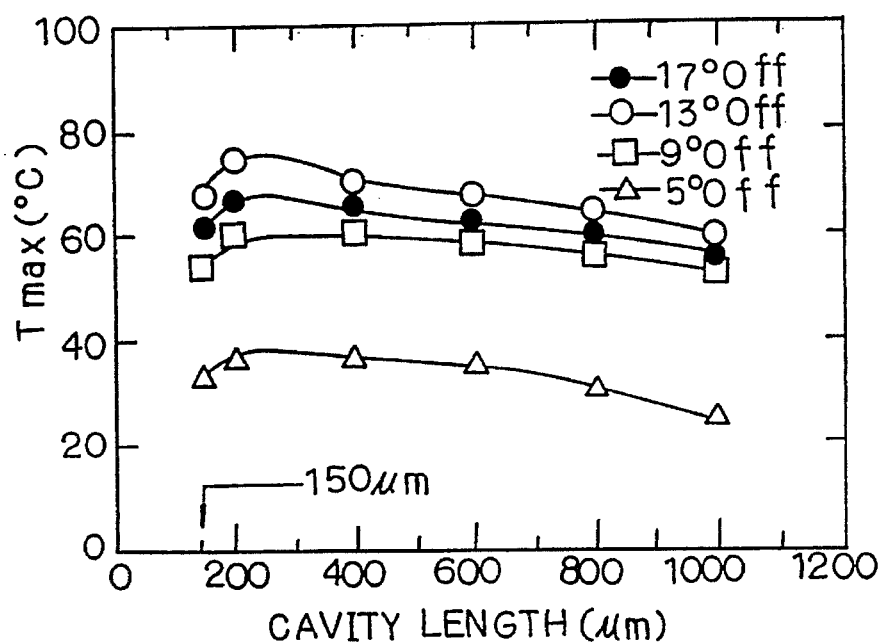
FIG. 10 is a diagram showing the relationship between the maximum operating temperature and the cavity length in the semiconductor laser device according to the second embodiment and a semiconductor laser device in a comparative example.

FIG. 10 shows the relationship between the maximum operating temperature $T_{max}$ (°C.) and the cavity length L (μm) in cases where the main surface of the semiconductor laser device is misoriented by 9°, 13° and 17° from the (100) plane in the [011] direction and a case where the main surface thereof is misoriented by 5° as a comparative example. In the present embodiment, a front facet of the laser device is coated with a reflection coating film composed of $Al_2O_3$ so that the index of reflection thereof is 30%, and a rear facet of the laser device is coated with a reflection coating film constituted by a laminated film of $Al_2O_3$ and Si so that the index of reflection thereof is 50%. In FIG. 10, an off angle θ=5° is indicated by a hollow triangle, an off angle θ=9° is indicated by a hollow square, an off angle θ=13° is indicated by a hollow circle, and an off angle θ=17° is indicated by a solid black circle. The measurements are made in a continuously oscillating state in a state where a device is pressed and mounted (fastened) on a Si heat sink (50 to 500μ in thickness) bonded and mounted (fastened) on a good radiator of an ordinary stem having a diameter of 9 mm by solder or the like through tin or the like, as in the first embodiment.

As can be seen from FIG. 10, in such a semiconductor laser device, the maximum operating temperature has a peak when the cavity length is 200 μm and is approximately 60° or more when it is not less than 150 μm nor more than 300 μm in the case of the off angle of not less than 9° nor more than 17°, unlike the conventionally known phenomenon that the maximum operating temperature is gradually decreased as the cavity length is decreased.

Figure 11:
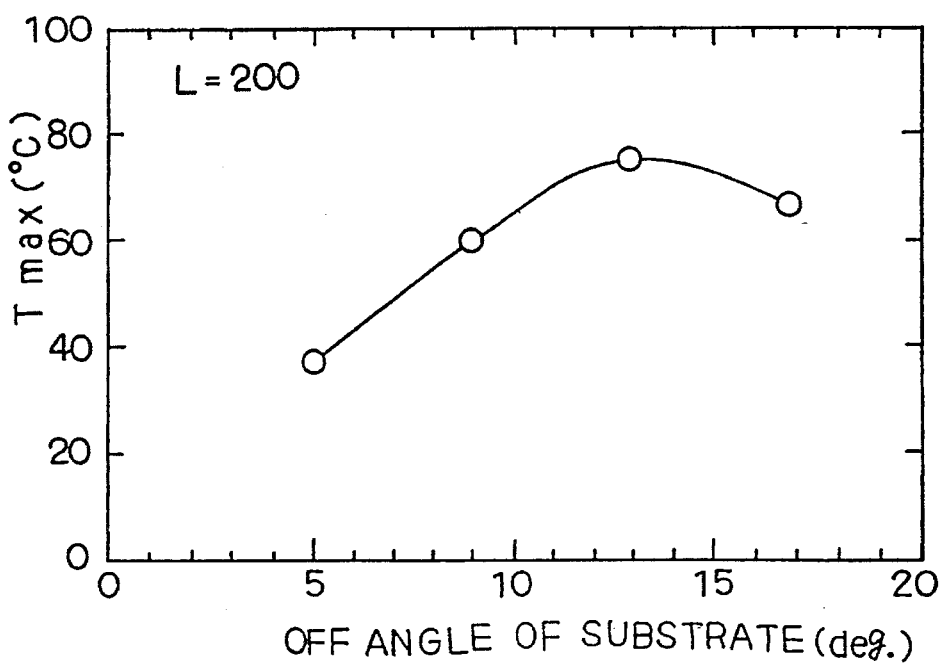
FIG. 11 is a diagram showing the relationship between the maximum operating temperature and the off angle of a GaAs substrate in the semiconductor laser devices according to the second embodiment and in the comparative example.

FIG. 11 shows the relationship between the maximum operating temperature $T_{max}$ (°C.) and the off angle θ (°) of the substrate which are obtained by making the same measurements as those shown in FIG. 10. The cavity length L is 200 μm.

As can be seen from FIG. 11, in such a semiconductor laser device, the maximum operating temperature is not less than 60° C. when the off angle θ is not less than 9° nor more than 17°, and is preferable, i.e., not less than 70° C. particularly when it is not less than 11° nor more than 17°, and is more preferable when it is around 13° in the case of the cavity length of 200 μm.

As can be seen from FIGS. 10 and 11, in such a semiconductor laser device, the cavity length is preferably not less than 150 μm nor more than 300 μm and is more preferably not less than 200 μm nor more than 300 μm, and the off angle θ is preferably not less than 9° nor more than 17° and particularly, not less than 11° nor more than 17° and is more preferably around 13°.

In the present embodiment, the same effect is obtained when the index of reflection of the front facet is not less than 30% and the index of reflection of the rear facet is not less than 50% or when the index of reflection of the front facet is not more than 30% and the index of reflection of the rear facet is not less than 70% in the facet coating.

Figure 12:
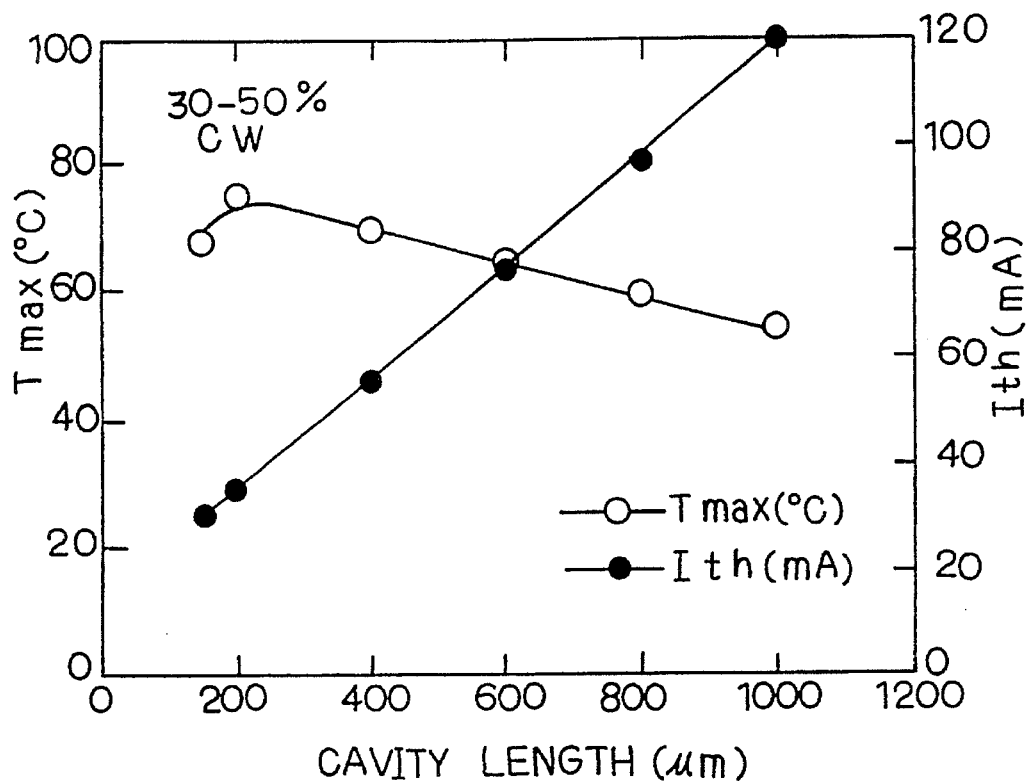
FIG. 12 is a diagram showing the relationship between the oscillation threshold current and the cavity length in the semiconductor laser device according to the second embodiment.
Figure 13:
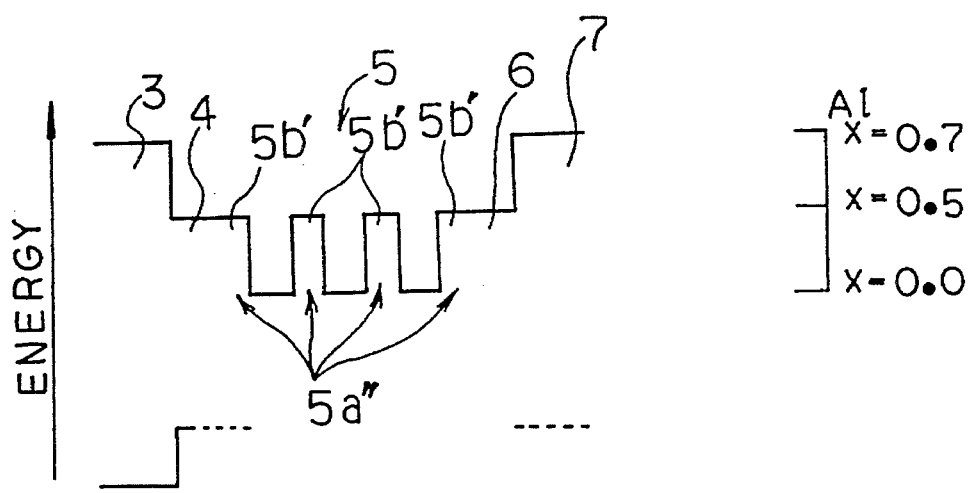
FIG. 13 is a diagram showing a band structure in the vicinity of an active layer of a semiconductor laser device according to a third embodiment.

FIG. 12 shows the relationship among the maximum operating temperature $T_{max}$ (°C.), the threshold current (mA) and the cavity length L (μm) which are obtained by making the same measurements as those shown in FIG. 10.

In FIG. 12, a hollow circle indicates the maximum operating temperature, and a solid black circle indicates the threshold current. The off angle θ of the substrate is 13°. The front facet of the laser device is coated with a reflection coating film composed of $Al_2O_3$ so that the index of reflection thereof is 30%, and the rear facet of the laser device is coated with a reflection coating film constituted by a laminated film of $Al_2O_3$ and Si so that the index of reflection thereof is 50%.

As can be seen from FIG. 12, even in such a semiconductor laser device, the threshold current is gradually decreased as the cavity length is decreased, as in the conventional semiconductor laser device. Particularly, it is found that the threshold current is approximately 40 mA or less when the cavity length is not more than 300 μm, while being approximately 30 mA or less when the cavity length is not more than 200 μm. When the cavity length is 200 μm, a confidence level of not less than 2000 hours can be confirmed at a device environmental temperature of 50° C. and at a light output of 5 mW.

Furthermore, the threshold current and the maximum operating temperature correspond to the off angle of the substrate, as in the above described first embodiment. If the maximum operating temperature is increased, the threshold current is decreased.

The reason why the semiconductor laser device according to the present embodiment is high in the maximum operating temperature and is low in the oscillation threshold current is that the semiconductor laser device comprises the n-type main surface of the substrate 1, the active layer 5 having a quantum well structure having the compressive strain quantum well layers 5a' formed on the n-type cladding layer 3, and the p-type cladding layers 7 and 9 formed on the active layer 5, the one main surface of the substrate 1 is a surface misoriented by 9° to 17° from the (100) plane in the [011] direction, and the cavity length is not less than 150 μm nor more than 300 μm. Specifically, step flow growth is made on at least the one main surface, so that a abrupt interface is formed between the quantum well layers and the quantum barrier layers. In-addition, the threshold current density can be decreased by introducing the compressive strain into the well layers. A multiple quantum barrier layer is preferably provided, although an effect is obtained even if it is not provided.

Although in the above described embodiment, the value of the strain on the quantum well layers in the active layer is +0.5%, an effect is obtained even if the quantum well layers have a compressive strain which differ in value from the strain. The number of well layers is not limited to 6. For example, the number of well layers may be not less than 1 nor more than 10.

Description is now made of a semiconductor laser device according to a third embodiment of the present invention. The present embodiment is directed to a semiconductor laser device having an oscillation wavelength of 635 nm using for an active layer a strain compensated type MQW structure capable of exerting strains in the opposite directions on well layers and barrier layers and exerting the large strain on the well layers. The third embodiment is of the same construction as the first embodiment except for the structure of the active layer 5. In the third embodiment, an undoped $(Al_{ya}Ga_{1-ya})_{0.5}In_{0.5}P$ (ya≧r: ya=0.5 in the present embodiment) optical guide layer 4 having a thickness of 200 to 500 Å, an undoped active layer 5 having a strain compensated type multiple quantum well structure (S-MQW structure) obtained by alternately laminating $(Al_pGa_{1-p})_qIn_{1-q}P$ (q>0.51: p=0, q=0.65 in the present embodiment) tensile strain quantum well layers $5a''$ (typically a total of not more than 10 layers: a total of three layers in the present invention) having a tensile strain 100 Å in thickness and $(Al_rGa_{1-r})_qIn_{1-q}P$ (q<0.51: q=0.44, r=0.5 in the present embodiment) quantum barrier layers $5b'$ (typically a total of not more than 9 layers: a total of two layers in the present embodiment) having a compressive strain 40 Å in thickness, and an undoped $(Al_{yb}Ga_{1-yb})_{0.5}In_{0.5}P$ (yb≧r: yb=0.5 in the present embodiment) optical guide layer 6 having a thickness of 200 to 500 Å are formed in this order using a MOCVD method. The value of the strain on the tensile strain quantum well layers $5a''$, $\Delta a_w$, in the present embodiment is −1.0%, and the value of the strain on the quantum barrier layers $5b$, $\Delta a_b$, is +0.5%.

Figure 14:
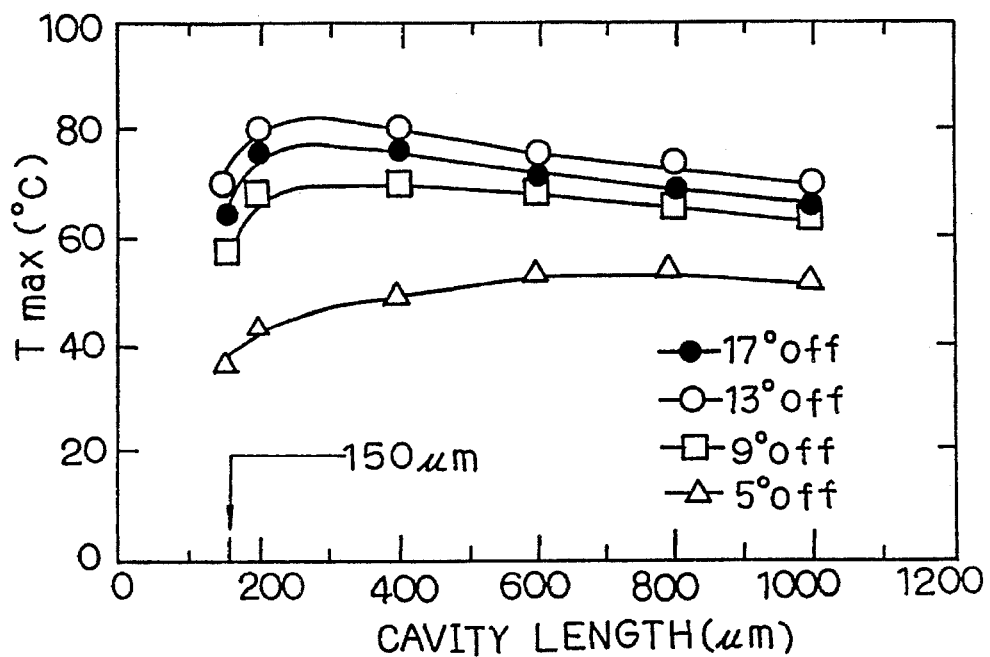
FIG. 14 is a diagram showing the relationship between the maximum operating temperature and the cavity length in the semiconductor laser device according to the third embodiment and a semiconductor laser device in a comparative example.

FIG. 14 shows the relationship between the maximum operating temperature $T_{max}$ (°C.) and the cavity length L (μm) in cases where the main surface of the semiconductor laser device is misoriented by 9°, 13° and 17° from a (100) plane of the substrate in a [011] direction and a case where the main surface thereof is misoriented by 5° as a comparative example. In the present embodiment, a front facet of the laser device is coated with a reflection coating film composed of $Al_2O_3$ so that the index of reflection thereof is 30%, and a rear facet of the laser device is coated with a reflection coating film constituted by a laminated film of $Al_2O_3$ and Si so that the index of reflection thereof is 50%. In FIG. 14, an off angle θ=5° is indicated by a hollow triangle, an off angle θ=9° is indicated by a hollow square, an off angle θ=13° is indicated by a hollow circle, and an off angle θ=17° is indicated by a solid black circle. The measurements are made in a continuously oscillating state in a state where a device is pressed and mounted (fastened) on a Si heat sink (50 to 500 μm in thickness) bonded and mounted (fastened) on a good heat radiator (a copper block) of an ordinary stem having a diameter of 9 mm by solder or the like through tin or the like, as in the first embodiment.

As can be seen from FIG. 14, in such a semiconductor laser device, the maximum operating temperature has a peak when the cavity length is 200 μm and is approximately 70° C. or more when it is not less than 150 μm nor more than 300 μm in the case of the off angle of not less than 9° nor more than 17°, unlike the conventionally known phenomenon that the maximum operating temperature is gradually decreased as the cavity length is decreased.

In the above described embodiment, the same effect is obtained when the index of reflection of the front facet is not less than 30% and the index of reflection of the rear facet is not less than 50% or when the index of reflection of the front facet is not more than 30% and the index of reflection of the rear facet is not less than 70% in the facet coating.

Figure 15:
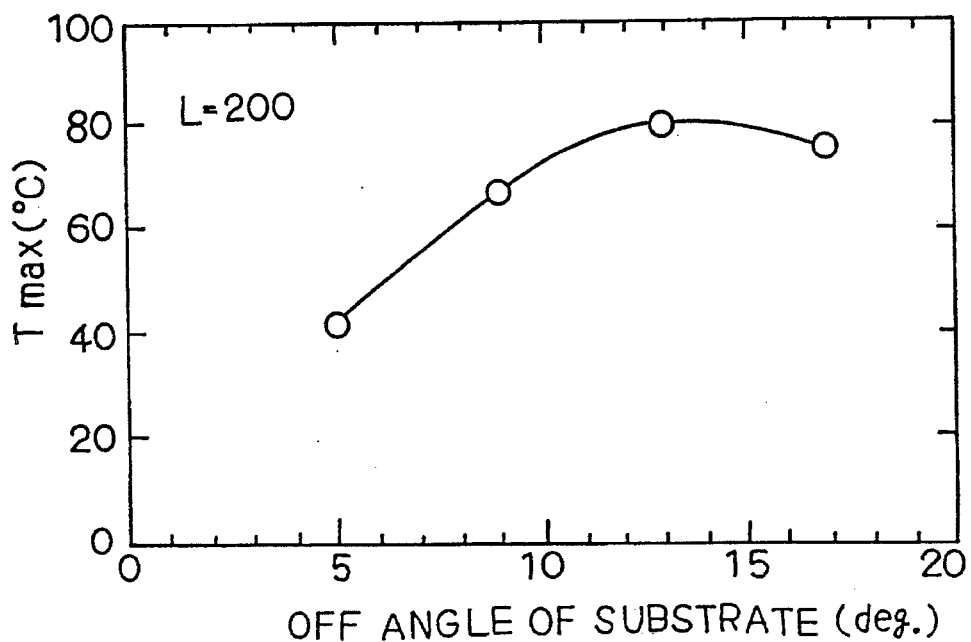
FIG. 15 is a diagram showing the relationship between the maximum operating temperature and the off angle of a GaAs substrate in the semiconductor laser devices according to the third embodiment and in the comparative example.

FIG. 15 shows the relationship between the maximum operating temperature $T_{max}$ (°C.) and the off angle θ (°) of the substrate which are obtained by making the same measurements as those shown in FIG. 14. The cavity length L is 200 μm.

As can be seen from FIG. 15, in such a semiconductor laser device, the maximum operating temperature is not less than 60° C. when the off angle θ is not less than 9° nor more than 17°, is preferable particularly when it is not less than 11° nor more than 17°, and is more preferable when it is around 13° in the case of the cavity length of 200 μm.

As can be seen from FIGS. 14 and 15, in such a semiconductor laser device, the cavity length is preferably not less than 150 μm nor more than 300 μm and is more preferably not less than 200 μm nor more than 300 μm, and the off angle θ is preferably not less than 9° nor more than 17° and particularly, not less than 11° nor more than 17° and is more preferably around 13°.

Figure 16:
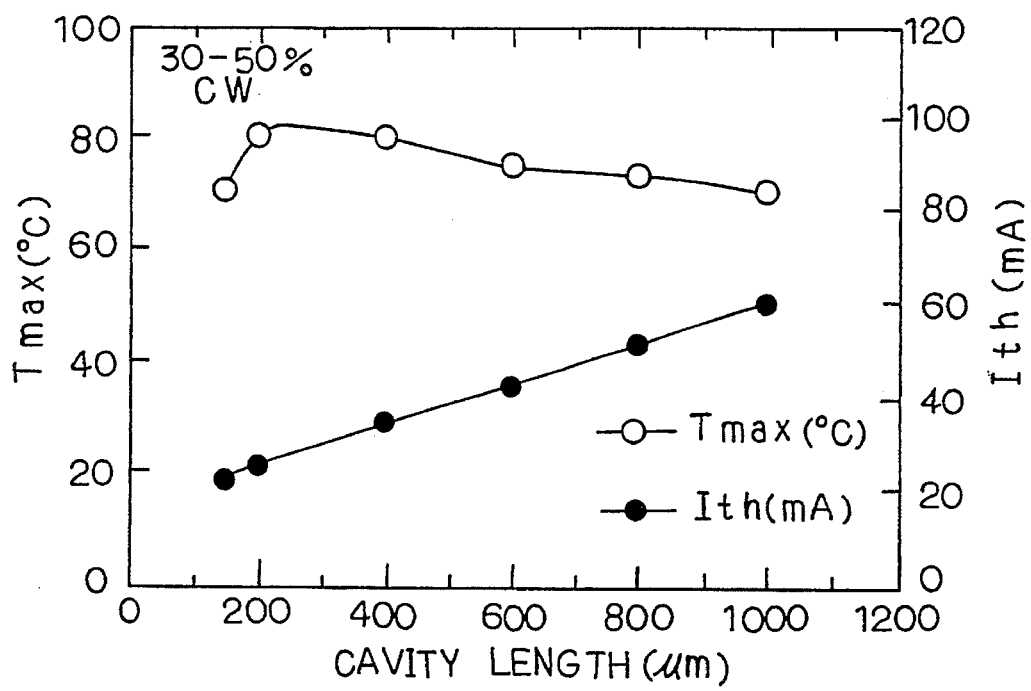
FIG. 16 is a diagram showing the relationship between the oscillation threshold current and the cavity length in the semiconductor laser device according to the third embodiment.

FIG. 16 shows the relationship among the maximum operating temperature $T_{max}$ (°C.), the threshold current (mA) and the cavity length L (μm) obtained by making the same measurements as those shown in FIG. 14. In FIG. 16, a hollow circle indicates the maximum operating temperature, and a solid black circle indicates the threshold current. The off angle θ of the substrate is 13°. The front facet of the laser device is coated with a reflection coating film composed of $Al_2O_3$ so that the index of reflection thereof is 30%, and the rear facet of the laser device is coated with a reflection coating film constituted by a laminated film of $Al_2O_3$ and Si so that the index of reflection thereof is 50%.

As can be seen from FIG. 16, in such a semiconductor laser device, the threshold current is gradually decreased as the cavity length is decreased, as in the conventional semiconductor laser device. Particularly, it is found that the threshold current is approximately 40 mA or less when the cavity length is not more than 300 m, while being approximately 30 mA or less when the cavity length is not more than 200 μm. When the cavity length is 200 μm, a confidence level of not less than 2000 hours can be confirmed at a device environmental temperature of 50° C. and at a light output of 5 mW.

Furthermore, the threshold current and the maximum operating temperature correspond to the off angle of the substrate, as in the above described first embodiment. If the maximum operating temperature is increased, the threshold current is decreased.

The reason why the semiconductor laser device according to the present embodiment is high in the maximum operating temperature and is low in the oscillation threshold current is that the semiconductor laser device comprises the n-type GaAs substrate 1, the n-type cladding layer 3 formed on one main surface of the substrate 1, the active layer 5 having a strain compensated type quantum well structure comprising the well layers $5a''$ having a tensile strain and the barrier layers $5b'$ having a compressive strain which are formed on the n-type cladding layer 3, and the p-type cladding layers 7 and 9 formed on the active layer 5, the one main surface of the substrate 1 is a surface misoriented by 9° to 17° from the (100) plane in the [011] direction, and the cavity length is not less than 150 μm nor more than 300 μm. Specifically, step flow growth is made on at least the one main surface. In addition, the value of the strain on the well layers can be increased by introducing the strain compensated type quantum well structure into the active layer, thereby to make it possible to make the well layers wider, resulting in improved crystallizability of each of the layers. A multiple quantum barrier layer is preferably provided, although an effect is obtained even if it is not provided.

Figure 17:
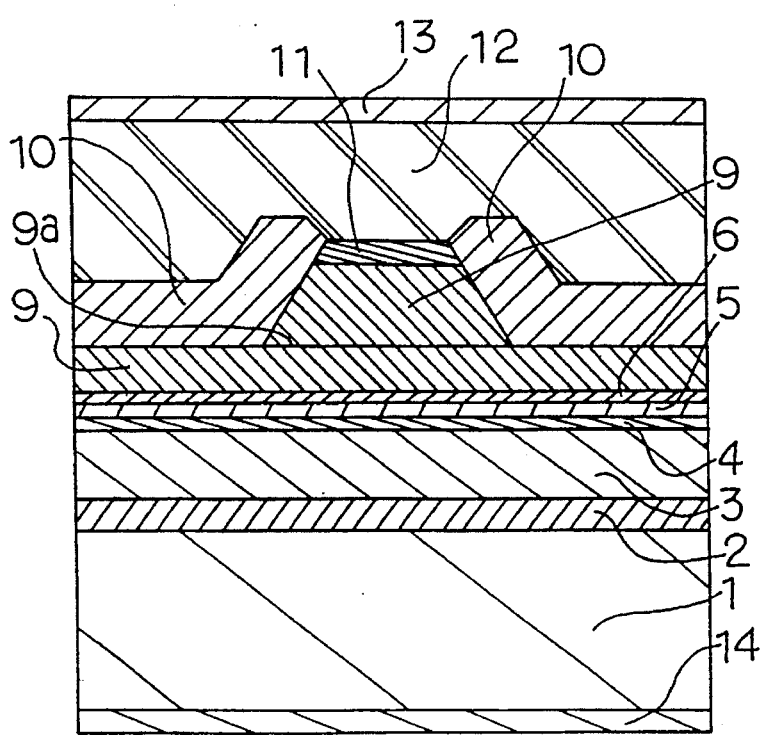
FIG. 17 is a schematic cross sectional view showing the construction of a semiconductor laser device according to a fourth embodiment of the present invention.
Figure 18:
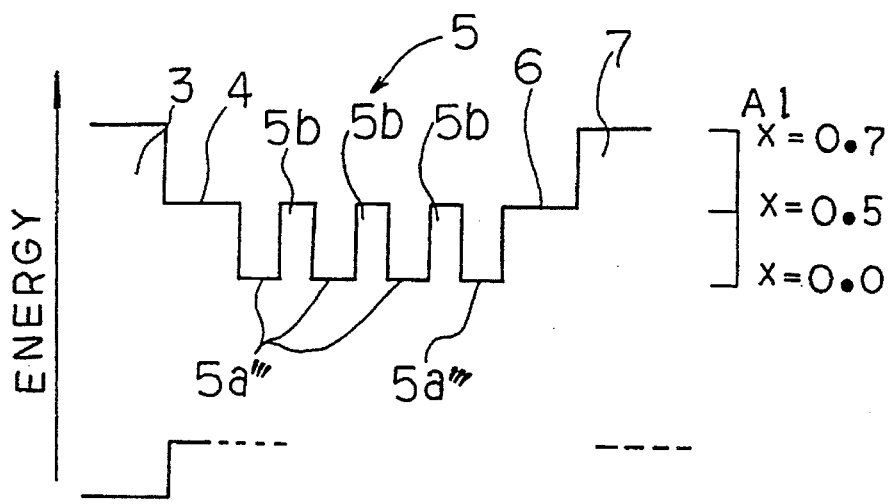
FIG. 18 is a diagram showing a band structure in the vicinity of an active layer of the semiconductor laser device according to the fourth embodiment.

Description is made of a semiconductor laser device according to a fourth embodiment of the present invention. The present embodiment is directed to a semiconductor laser device of an AlGaInP system having an oscillation wavelength of 670 nm. FIG. 17 is a schematic cross sectional view showing the construction of the semiconductor laser device, and FIG. 18 is a diagram showing a band structure in the vicinity of an active layer of the semiconductor laser device.

The fourth embodiment of the present invention uses an n-type GaAs substrate 1 similarly to the second embodiment. One main surface of the GaAs substrate 1 is a surface misoriented by an angle θ (θ=9° to 17°: the angle θ shall be referred to as an off angle θ) from a (100) plane of the substrate in a [011] direction. An n-type $Ga_{0.5}In_{0.5}P$ buffer layer 2 having a thickness of 0.3 μm and an n-type $(Al_{xa}Ga_{1-xa})_{0.5}In_{0.5}P$ (xa>ya, yb>p≧0: xa=0.7 in the present embodiment) cladding layer 3 having a thickness of 0.8 to 0.9 μm are formed in this order on the one main surface by a MOCVD method.

An undoped $(Al_{ya}Ga_{1-ya})_{0.5}In_{0.5}P$ (ya≧r: ya=0.5 in the present embodiment) optical guide layer 4 having a thickness of 200 Å, an undoped active layer 5 having a compressive strain multiple quantum well structure (compressive strain MQW structure) obtained by alternately laminating $(Al_pGa_{1-p})_qIn_{1-q}P$ (q<0.51: p=0, q=0.44 in the present embodiment) compressive strain quantum well layers 5a''' (typically a total of not more than ten layers: a total of four layers in the present embodiment) having a compressive strain 80 Å in thickness and $(Al_rGa_{1-r})_{0.5}In_{0.5}P$ (xa, xb, c>r>p: r=0.5 in the present embodiment) quantum barrier layers 5b (typically a total of not more than nine layers: a total of three layers in the present embodiment) 40 Å in thickness, and an undoped $(Al_{yb}Ga_{1-yb})_{0.5}In_{0.5}P$ (yb≧r: yb=0.5 in the present embodiment) optical guide layer 6 having a thickness of 200 Å are formed in this order by using the MOCVD method. The value of the strain on the compressive strain quantum well layers 5a''', $\Delta a_w$, in the present embodiment is +0.5%.

A p-type $(Al_{xc}Ga_{1-xc})_{0.5}In_{0.5}P$ (xc>ya, yb>p≧0: xc=0.7 in the present embodiment) cladding layer 9 having stripe-shaped ridge 0.9 μm in height, 5 μm in width in its lower surface portion and extending in the direction of the cavity length, and having a thickness of 0.2 to 0.3 μm on both sides of the ridge is formed on the optical guide layer 6. In the present embodiment, the cladding layer 9 is laminated to a thickness of 0.2 to 0.3 μm from the optical guide layer 6 so that the layer thickness on both sides of the ridge becomes 0.2 to 0.3 μm in forming the ridge by etching and then, an etching stopper layer 9a is provided. The etching stopper layer 9a is formed so as to differ from the p-type $(Al_{xc}Ga_{1-xc})_{0.5}In_{0.5}P$ cladding layer 9 in the Al composition ratio.

n-type GaAs current blocking layers 10 having a thickness of 1 μm are formed on the p-type cladding layer 9 so as to cover both side surfaces of the ridge, and a p-type $Ga_{0.5}In_{0.5}P$ contact layer 11 having a thickness of 0.1 μm is formed on the surface of the ridge.

A p-type GaAs cap layer 12 having a thickness of 2 to 5 μm on the contact layer 11 is formed on the current blocking layers 10 and the contact layer 11.

A p-type ohmic electrode 13 composed of Au—Cr is formed on the upper surface of the cap layer 12, and an n-type ohmic electrode 13 composed of Au—Sn—Cr is formed on the lower surface of the n-type GaAs substrate 1.

As can be seen from FIG. 18, the semiconductor laser device is so constructed that the active layer 5 is interposed between the optical guide layers 4 and 6 which are equal to (or more than) the quantum barrier layers 5b in a band gap, the optical guide layers 4 and 6 are interposed between the cladding layers 3 and 7 which are more than the optical guide layers 4 and 6 in a band gap.

Figure 19:
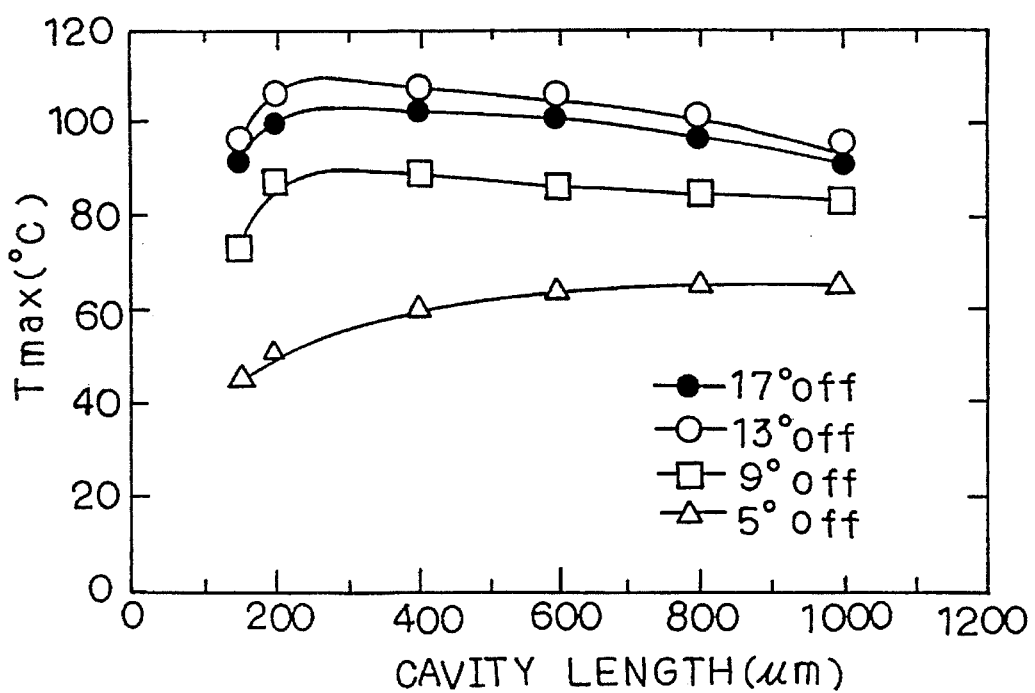
FIG. 19 is a diagram showing the relationship between the maximum operating temperature and the cavity length in the semiconductor laser device according to the fourth embodiment and a semiconductor laser device in a comparative example.

FIG. 19 shows the relationship between the maximum operating temperature $T_{max}$ (°C.) and the cavity length L (μm) in cases where the main surface of the semiconductor laser device is misoriented by 9°, 13° and 17° from the (100) plane in the [011] direction and a case where the main surface thereof is misoriented by 5° as a comparative example. In FIG. 19, an off angle θ=5° is indicated by a hollow triangle, an off angle θ=9° is indicated by a hollow square, an off angle θ=13° is indicated by a hollow circle, and an off angle θ=17° is indicated by a solid black circle. In the present embodiment, a front facet of the laser device is coated with a reflection coating film composed of $Al_2O_3$ so that the index of reflection thereof is 30%, and a rear facet of the laser device is coated with a reflection coating film constituted by a laminated film of $Al_2O_3$ and Si so that the index of reflection thereof is 30%. The measurements are made in a continuously oscillating state in a state where a device is pressed and mounted (fastened) on a Si heat sink (50 to 500 μm in thickness) bonded and mounted (fastened) on a good heat radiator (a copper block) of an ordinary stem having a diameter of 9 mm by solder or the like, or tin or the like as in the first embodiment.

As can be seen from FIG. 19, in such a semiconductor laser device, the maximum operating temperature has a peak when the cavity length is 200 μm and is approximately 80° or more when it is not less than 150 μm nor more than 300 μm in the case of the off angle of not less than 9° nor more than 17°, unlike the conventionally known phenomenon that the maximum operating temperature is gradually decreased as the cavity length is decreased.

In the present embodiment, the same effect is obtained when the index of reflection of the front facet is not less than 30% and the index of reflection of the rear facet is not less than 30% or when the index of reflection of the front facet is not more than 30% and the index of reflection of the rear facet is not less than 70% with respect to a device having a relatively large wavelength in the facet coating.

Figure 20:
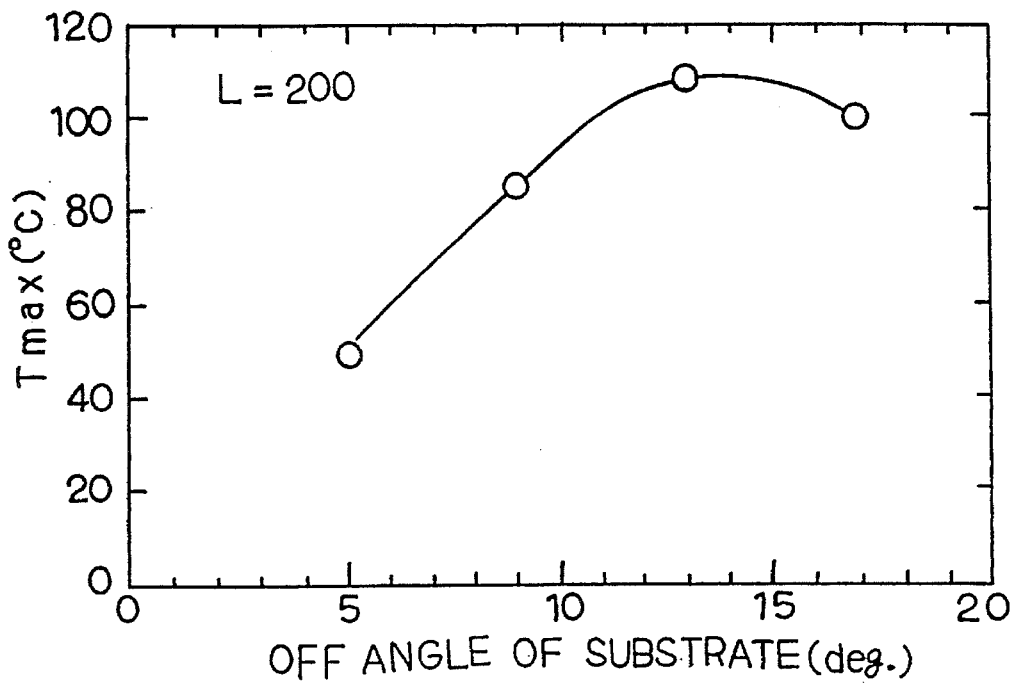
FIG. 20 is a diagram showing the relationship between the maximum operating temperature and the off angle of a GaAs substrate in the semiconductor laser devices according to the fourth embodiment and in the comparative example.

FIG. 20 shows the relationship between the maximum operating temperature $T_{max}$ (°C.) and the off angle θ(°) of the substrate which are obtained by making the same measurements as those shown in FIG. 19. The cavity length L is 200 μm.

As can be seen from FIG. 20, in such a semiconductor laser device, the maximum operating temperature is not less than 80° C. when the off angle θ is not less than 9° nor more than 17°, and is preferable particularly when it is not less than 11° nor more than 17°, and is more preferable when it is approximately 13° in the case of the cavity length of 200 μm.

As can be seen from FIGS. 19 and 20, in such a semiconductor laser device, the cavity length is preferably not less than 150 μm nor more than 300 μm and is more preferably not less than 200 μm nor more than 300 μm, and the off angle θ is not less than 9° nor more than 17° and particularly, not less than 11° nor more than 17° and is more preferably approximately 13°.

Figure 21:
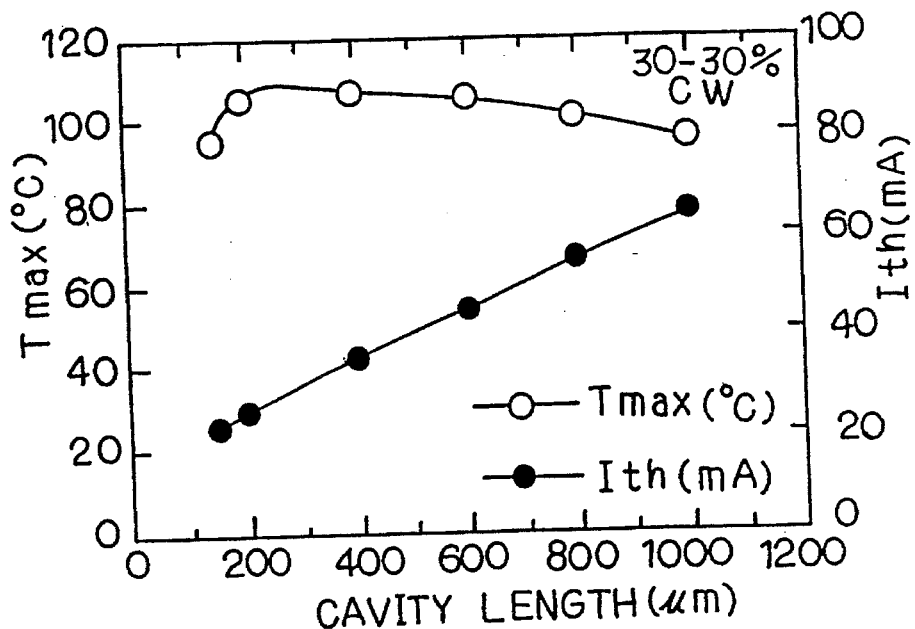
FIG. 21 is a diagram showing the relationship between the oscillation threshold current and the cavity length in the semiconductor laser device according to the fourth embodiment.

FIG. 21 shows the relationship among the maximum operating temperature $T_{max}$ (°C.), the oscillation threshold current (mA) and the cavity length L (μm) which are obtained by making the same measurements as those shown in FIG. 19. In FIG. 21, a hollow circle indicates the maximum operating temperature, and a solid black circle indicates the threshold current. The off angle θ of the substrate is 13°. The front facet and the rear facet of the laser device are coated with a reflection coating film composed of $Al_2O_3$ so that the index of reflection thereof is 30%.

As can be seen from FIG. 21, in such a semiconductor laser device, the threshold current is gradually decreased as the cavity length is decreased, as in the conventional semiconductor device. Particularly, it is found that the threshold current is approximately 40 mA or less when the cavity length is not more than 300 μm, while being approximately 30 mA or less when it is not more than 200 μm. When the cavity length is 200 μm, a confidence level of not less than 2000 hours can be confirmed at a device environmental temperature of 60° C. and at a light output of 5 mW.

Furthermore, the threshold current and the maximum operating temperature correspond to the off angle of the substrate, as in the above described first embodiment. If the maximum operating temperature is increased, the threshold current is decreased.

The reason why the semiconductor laser device according to the present embodiment is high in the maximum operating temperature and is low in the oscillation threshold current is that the semiconductor laser device comprises the n-type GaAs substrate 1, the n-type cladding layer 3 formed on one main surface of the substrate 1, the active layer 5 having a quantum well structure comprising the compressive strain quantum well layers $5a'''$ formed on the n-type cladding layer 3, and the p-type cladding layers 7 and 9 formed on the active layer 5, the one main surface of the substrate 1 is a surface misoriented by 9° to 17° from the (100) plane in the [011] direction, and the cavity length is not less than 150 µm nor more than 300 µm. Specifically, step flow growth is made on at least the one main surface, so that a abrupt interface is obtained between the quantum well layers and the quantum barrier layers. In addition, the threshold current density can be decreased by introducing the compressive strain into the well layers.

Although in the above described embodiment, the strain on the quantum well layers in the active layer is +0.5%, an effect is obtained even if the quantum well layers have a compressive strain which differs in value from the strain. The number of well layers is not limited to 4. For example, the number of well layers may be not less than 1 nor more than 10. A multiple quantum barrier layer is preferably provided, although it is not provided in the present embodiment.

Additionally, although in the above described embodiments, the one main surface of the GaAs substrate 1 is misoriented from the (100) plane in the [011] direction, the same effect is obtained if the main surface of the GaAs substrate 1 is a surface equivalent to the surface misoriented from the (100) plane in the [011] direction. Specifically, one main surface (a crystal grown plane) of the GaAs substrate may be a surface misoriented from a (100) plane of the substrate in a [011] direction, a surface misoriented from a (010) plane of the substrate in a [101] or [-10-1] direction, and a surface misoriented from a (001) plane of the substrate in a [110] or [-1-10] direction, that is, a surface misoriented from a {100} plane of the substrate in a <011> direction.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device comprising:

a GaAs substrate of a first conductivity type;

a cladding layer of the first conductivity type formed on a major surface of the substrate;

an active layer having a quantum well structure in which a tensile strain quantum well layer and a quantum barrier layer are formed on the cladding layer of the first conductivity type alternately laminated; and a cladding layer of a second conductivity type formed on the active layer, the major surface of said substrate being a surface misoriented by approximately 13° from a {100} plane of the substrate in a <011> direction, the cavity length being not less than 150 µm nor more than 300 µm.

2. The semiconductor laser device according to claim 1 wherein facets of at least said active layer are further respectively provided with reflection coating films.

3. The semiconductor laser device according to claim 1, wherein the number of laminations of each of said well layer and said barrier layer is not more than 8.

4. A semiconductor laser device comprising:

a GaAs substrate of a first conductivity type;

a cladding layer of the first conductivity type formed on a major surface of the substrate;

an active layer having a quantum well structure in which a tensile strain quantum well layer and a quantum barrier layer are formed on the cladding layer of the first conductivity type alternately laminated; and a cladding layer of a second conductivity type formed on the active layer, the major surface of said substrate being a surface misoriented by approximately 13° from a {100} plane of the substrate in a <011> direction, the cavity length being not less than 150 µm nor more than 300 µm, wherein said well layer is comprised of $(Al_{x1}Ga_{1-x1})_{y1}In_{1-y1}P$, and said barrier layer is comprised of $(Al_{x2}Ga_{1-x2})_{y2}In_{1-y2}P$, and the range of x1 and x2 satisfy the relationship of $1.0 \geq x2 > x1 \geq 0$.

5. A semiconductor laser device comprising:

a GaAs substrate of a first conductivity type;

a cladding layer of the first conductivity type formed on a major surface of the substrate;

an active layer having a quantum well structure in which a tensile strain quantum well layer and a quantum barrier layer are formed on the cladding layer of the first conductivity type alternately laminated; and a cladding layer of a second conductivity type formed on the active layer, said major surface of said substrate being a surface misoriented by approximately 13° from a {100} plane of the substrate in the <011> direction, the cavity length being not less than 150 µm nor more than 300 µm, wherein facets of at least said active layer are further respectively provided with reflection coating films, the index of reflection of the front facet is less than 30% and the index of reflection of the rear facet is more than 70% by said reflection coating films.

6. A semiconductor laser device comprising:

a GaAs substrate of a first conductivity type;

a cladding layer of the first conductivity type formed on a major surface of the substrate;

an active layer having a quantum well structure in which a tensile strain quantum well layer and a quantum barrier layer are formed on the cladding layer of the first conductivity type alternately laminated;

a cladding layer of a second conductivity type formed on said active layer; and a reflection coating film formed on front and rear facets of said active layer, the major surface of said substrate being a surface misoriented by not less than 9° nor more than 17° from a {100} plane of the substrate in a <011> direction;

the index of reflection of the front facet is not less than 30% and the index of reflection of the rear facet is not less than 50% by said reflection coating films.

7. The semiconductor laser device according to claim 6,
the index of reflection of the front facet is approximately 30% and the index of reflection of the rear facet is 50 to 60%.

8. The semiconductor device according to claim 6, wherein said well layer is comprised of $(Al_{x1}Ga_{1-x1})_{y1}In_{1-y1}P$, said barrier layer is comprised of $(Al_{x2}Ga_{1-x2})_{y2}In_{1-y2}P$, and the range of x1 and x2 satisfy the relationship of $1.0 \geq x2 > x1 \geq 0$.

9. A semiconductor laser device comprising:

a GaAs substrate of a first conductivity type;

a cladding layer of the first conductivity type formed on a major surface of the substrate;

an active layer having a quantum well structure in which a tensile strain quantum well layer and a quantum barrier layer are formed on the cladding layer of the first conductivity type alternately laminated;

a cladding layer of a second conductivity type formed on the active layer, said major surface of said substrate being a surface misoriented by approximately 13° from a {100} plane of the substrate in the <011> direction, the cavity length being not less than 150 μm nor more than 300 μm, wherein facets of at least said active layer are further respectively provided with reflection coating films, the index of reflection of the front facet is 10 to 20% and the index of reflection of the rear facet is 80 to 100% by said reflection coating films.

10. A semiconductor laser device comprising:

a GaAs substrate of a first conductivity type;

a cladding layer of the first conductivity type formed on a major surface of the substrate;

an active layer having a quantum well structure in which a compressive strain quantum well layer and a quantum barrier layer are formed on the cladding layer of the first conductivity type alternately laminated; and a cladding layer of a second conductivity type formed on the active layer, the major surface of said substrate being a surface misoriented by approximately 13° from a {100} plane of the substrate in a <011> direction, the cavity length being not less than 150 μm nor more than 300 μm.

11. The semiconductor device according to claim 10, wherein said well layer is comprised of $(Al_{x1}Ga_{1-x1})_{y1}In_{1-y1}P$, said barrier layer is comprised of $(Al_{x2}Ga_{1-x2})_{y2}In_{1-y2}P$, and the range of x1 and x2 satisfy the relationship of $1.0 \geq x2 > x1 \geq 0$.

12. The semiconductor laser device according to claim 10, wherein the number of laminations of each of said well layer and said barrier layer is not more than 10.

13. The semiconductor laser device according to claim 10, wherein facets of at least said active layer are further respectively provided with reflection coating.

14. The semiconductor laser device according to claim 13, wherein the index of reflection of the front facet is less than 30% and the index of reflection of the rear facet is not less than 70% by said reflection coating films.

15. The semiconductor laser device according to claim 13, wherein the index of reflection of the front face is 10 to 20% and the index of reflection of the rear facet is 80 to 100% by said reflection coating films.

16. A semiconductor laser device comprising:

a GaAs substrate of a first conductivity type;

a cladding layer of the first conductivity type formed on a major surface of the substrate;

an active layer having a quantum well structure in which a compressive strain quantum well layer and a quantum barrier layer are formed on the cladding layer of the first conductivity type alternately laminated;

a cladding layer of a second conductivity type formed on the active layer; and a reflection coating film being formed on front and rear facets of the active layer, the major surface of said substrate being a surface misoriented by not less than 9° nor more than 17° from a {100} plane of the substrate in a <011> direction, the cavity length being not less than 150 μm nor more than 300 μm, the index of reflection of the front facet is not less than 30% and the index of reflection of the rear facet is not less than 50% by said reflection coating films.

17. The semiconductor laser device according to claim 16, wherein the number of laminations of each of said well layer and said barrier layer is not more than 10.

18. The semiconductor device according to claim 16 wherein said well layer is comprised of $(Al_{x1}Ga_{1-x1})_{y1}In_{1-y1}P$, said barrier layer is comprised of $(Al_{x2}Ga_{1-x2})_{y2}In_{1-y2}P$, and the range of x1 and x2 satisfy the relationship of $1.0 \geq x2 > x1 \geq 0$.

19. The semiconductor laser device according to claim 16, wherein the index of reflection of the front facet is approximately 30% and the index of reflection of the rear facet is 50% to 60%.

20. A semiconductor laser device comprising:

a GaAs substrate of a first conductivity type;

a cladding layer of the first conductivity type formed on a major surface of the substrate;

an active layer having a strain compensated type quantum well structure in which a quantum well layer and a quantum barrier which are formed on the cladding layer of the first conductivity type and on which strains in the opposite directions are exerted are alternately laminated; and a cladding layer of a second conductivity type formed on the active layer, the major surface of said substrate being a surface misoriented by approximately 13° from a from a {100} plane of the substrate in a <011> direction, the cavity length being not less than 150 μm nor more than 300 μm.

21. The semiconductor laser device according to claim 20, wherein facets of at least said active layer are further respectively provided with reflection coating films.

22. The semiconductor laser device according to claim 20, wherein the index of reflection of the front facet is less than 30% and the index of reflection of the rear facet is not less than 70% by said reflection coating films.

23. The semiconductor device according to claim 20, wherein said well layer is composed of $(Al_{x1}Ga_{1-x1})_{y1}In_{1-y1}P$, said barrier layer is composed of $(Al_{x2}Ga_{1-x2})_{y2}In_{1-y2}P$, and the range of x1 and x2 satisfy the relationship of $1.0 \geq x2 > x1 \geq 0$.

24. The semiconductor laser device according to claim 20, wherein the index of reflection of the front facet is 10 to 20% and the index of reflection of the rear facet is 80 to 100% by said reflection coating films.

25. The semiconductor laser device according to claim 20, wherein the number of laminations of each of said well layer and said barrier layer is not more than 10.

26. A semiconductor laser device comprising:

a GaAs substrate of a first conductivity type;

a cladding layer of the first conductivity type formed on a major surface of the substrate;

an active layer having a strain compensated type quantum well structure in which a quantum well layer and a quantum barrier which are formed on the cladding layer of the first conductivity type and on which strains in the opposite directions are exerted are alternately laminated;

a cladding layer of a second conductivity type formed on the active layer; and a reflection coating film formed on front and rear facets of the active layer, the major surface of said substrate being a surface misoriented by not less than 9° nor more than 17° from a {100} plane of the substrate in a <011> direction, the cavity length being not less than 150 µm nor more than 300 µm, the index of reflection of the front facet is not less than 30% and the index of reflection of the rear facet is not less than 50% by said reflection coating films.

27. The semiconductor laser device according to claim 26, wherein the index of reflection of the front facet is approximately 30% and the index of reflection of the rear facet is 50% to 60%.

28. The semiconductor laser device according to claim 26, wherein the number of laminations of each of said well layer and said barrier layer is not more than 10.

29. The semiconductor device according to claim 26, wherein said well layer is composed of $(Al_{x1}Ga_{1-x1})_{y1}In_{1-y1}P$, said barrier layer is composed of $(Al_{x2}Ga_{1-x2})_{y2}In_{1-y2}P$, and the range of x1 and x2 satisfy the relationship of $1.0 \geq x2 > x1 \geq 0$.

30. The semiconductor laser device according to claim 6, wherein the number of laminations of each of said well layer and said barrier layer is not more than 8.

* * * * *